United States Patent

Takeyama et al.

[11] Patent Number: 5,852,560
[45] Date of Patent: Dec. 22, 1998

[54] APPARATUS FOR ASSESSING A LOAD THAT INDUSTRIAL PRODUCTS APPLY TO THE ENVIRONMENT

[75] Inventors: Norio Takeyama, Yokohama; Hideyo Kagami, Kamakura, both of Japan

[73] Assignee: Kabushiki Kaisha Toshiba, Kawasaki, Japan

[21] Appl. No.: 866,060

[22] Filed: May 30, 1997

[30] Foreign Application Priority Data

May 31, 1996 [JP] Japan ................................. 8-139269

[51] Int. Cl.$^6$ ................................................. G06F 19/00
[52] U.S. Cl. ............................... 364/468.03; 364/468.13; 364/156
[58] Field of Search ................ 364/468.03, 468.04, 364/468.05, 468.09, 468.13, 468.15, 156; 702/1, 2; 705/1, 7, 8

[56] References Cited

U.S. PATENT DOCUMENTS 5,311,437  5/1994  Leal et al. ........................... 364/156 X
5,652,708  7/1997  Miyamoto et al. ................. 364/468.13

FOREIGN PATENT DOCUMENTS 7-311760  11/1995  Japan .

OTHER PUBLICATIONS

T. Inaba, et al. "Environmental Management", vol. 31, No. 7 (1995), pp. 91–97.

*Primary Examiner*—Joseph Ruggiero
*Attorney, Agent, or Firm*—Oblon, Spivak, McClelland, Maier & Neustadt, P.C.

[57] ABSTRACT

An environmental load equation storage section that stores the environmental load equations modeled on a stage at which a product is produced and used and a stage of waste treatment and recycling, with the life cycle of the product being divided into at least the two stages, a unit load emission storage section that stores conversion coefficients used to convert the amounts of materials and energy consumed in producing, using, waste-treating, and recycling the product into the amount of environmental load factors emitted as a result of those operations, an input section for entering the amounts of materials and energy consumed in producing, using, waste-treating, and recycling the product, for each of the modeled stages, a computing section that calculates the amount of emission of environmental load factors by applying the amounts of materials and energy fed and the conversion coefficients corresponding to the amounts to the environmental load equations, an assessment section for assessing a load that the product applies to the environment on the basis of the calculation result, and an output section that outputs the assessment result.

21 Claims, 44 Drawing Sheets

① MATERIAL ACQUISITION STAGE

| | MATERIAL/PART NAME | UNIT | PARTNAME 1 | PARTNAME 2 | TOTAL | CO₂ UNIT LOAD EMISSION | CO₂ AMOUNT OF EMISSION (g) | SOₓ UNIT LOAD EMISSION | SOₓ AMOUNT OF EMISSION (mg) | NOₓ UNIT LOAD EMISSION | NOₓ AMOUNT OF EMISSION (mg) |
|---|---|---|---|---|---|---|---|---|---|---|---|
| IRON | STEEL | g | | | 0 | #.####E+## | 0.00 | #.####E+## | 0.00 | #.####E+## | 0.00 |
| | BOLT, SCREW SPRING | g | | | 0 | #.####E+## | 0.00 | #.####E+## | 0.00 | #.####E+## | 0.00 |
| NONFERROUS | ALUMINUM | g | | | 0 | #.####E+## | 0.00 | #.####E+## | 0.00 | #.####E+## | 0.00 |
| | COPPER | g | | | 0 | #.####E+## | 0.00 | #.####E+## | 0.00 | #.####E+## | 0.00 |
| | OTHER NONFERROUS METALS | g | | | 0 | #.####E+## | 0.00 | #.####E+## | 0.00 | #.####E+## | 0.00 |
| RESIN | THERMOPLASTIC RESIN | g | | | 0 | #.####E+## | 0.00 | #.####E+## | 0.00 | #.####E+## | 0.00 |
| | THERMOSET RESIN | g | | | 0 | #.####E+## | 0.00 | #.####E+## | 0.00 | #.####E+## | 0.00 |
| | RUBBER | g | | | 0 | #.####E+## | 0.00 | #.####E+## | 0.00 | #.####E+## | 0.00 |
| INORGANIC | GLASS | g | | | 0 | #.####E+## | 0.00 | #.####E+## | 0.00 | #.####E+## | 0.00 |
| FIBER | PRINTED MATTER PUBLICATION | g | | | 0 | #.####E+## | 0.00 | #.####E+## | 0.00 | #.####E+## | 0.00 |
| | PAPER, CORRUGATED CARDBOARD | m²/g | | | 0/0 | #.####E+## | 0.00 | #.####E+## | 0.00 | #.####E+## | — |
| | FIBER | m²/g | | | 0/0 | #.####E+## | 0.00 | #.####E+## | 0.00 | #.####E+## | — |
| ELECTRONICS PARTS | SEMICONDUCTOR, INTEGRATED CIRCUIT | NUMBER/g | | | 0 | #.####E+## | 0.00 | #.####E+## | 0.00 | #.####E+## | — |
| | OTHER ELECTRONIC PARTS | g | | | 0 | #.####E+## | 0.00 | #.####E+## | 0.00 | #.####E+## | 0.00 |
| | ELECTRIC WIRE, CABLE | m/g | | | 0 | #.####E+## | 0.00 | #.####E+## | 0.00 | #.####E+## | 0.00 |
| | BATTERY | NUMBER/g | | | 0 | #.####E+## | 0.00 | #.####E+## | 0.00 | #.####E+## | 0.00 |
| OTHERS | | | | | | | | | | | |
| | | | | | | | | | | | |
| TOTAL | | g | | | 0 | | 0.00 | | 0.00 | | 0.00 |

FIG. 4

② . PROUDUCTION STAGE

| MATERIAL NAME | UNIT | RECEPTION | ASSEMBLY STEP | INSPECTION STEP | SHIPPING STEP | TOTAL | $CO_2$ UNIT LOAD EMISSION | $CO_2$ AMOUNT OF EMISSION (g) | $SO_X$ UNIT LOAD EMISSION | $SO_X$ AMOUNT OF EMISSION (mg) | $NO_X$ UNIT LOAD EMISSION | $NO_X$ AMOUNT OF EMISSION (mg) |
|---|---|---|---|---|---|---|---|---|---|---|---|---|
| ELECTRICITY | KWH | | | | | 0 | #.####E+### | 0.00 | #.####E+## | 0.00 | #.####E+## | 0.00 |
| WATER | $m^3$ | | | | | 0 | #.####E+### | 0.00 | #.####E+## | 0.00 | #.####E+## | 0.00 |
| GAS | $m^3$ | | | | | 0 | #.####E+### | 0.00 | #.####E+## | 0.00 | #.####E+## | 0.00 |
| AIR (COMPRESSED GAS) | $m^3$ | | | | | 0 | #.####E+### | 0.00 | #.####E+## | 0.00 | #.####E+## | 0.00 |
| PETROCHEM- ICAL TRODUCT | L | | | | | | #.####E+### | | #.####E+## | 0.00 | #.####E+## | |
| | | | | | | | | | | | | |
| TOTAL | | | | | | 0 | | 0 | | 0 | | 0 |

FIG. 5

③. DISTRIBUTION STAGE

| ITEM | | UNIT | CONDITION | INPUT AMOUNT | CO₂ | | SOₓ | | NOₓ | |
|---|---|---|---|---|---|---|---|---|---|---|
| | | | | | UNIT LOAD EMISSION | AMOUNT OF EMISSION (g) | UNIT LOAD EMISSION | AMOUNT OF EMISSION (mg) | UNIT LOAD EMISSION | AMOUNT OF EMISSION (mg) |
| PRODUCT PACKAGE CAPACITY | | m³ | PACKAGE'S OUTER DIMENSIONS (W*D*H) | | — | — | — | — | — | — |
| NUMBER OF PRODUCTS LOADED ON TRUCK | | NUMBER | REMARKS WHEN LOADINS CONDITIONS ARE LIMITED | | | | | | | |
| TRANSPORT | FACTORY→ SALES FOOTHOLDS DISTANCE | km | 10-ton trucks (40M³) LOADED TO 80%CAPACITY (÷NUMBER OF PROUDUCTS LOADED) | | #.####E+## | 0.00 | #.####E+## | 0.00 | #.####E+## | 0.00 |
| TRANSPORT | FOOTHOLDS →SHOPS DISTANCE | km | 2-ton trucks (9M³) LOADED TO 80% CAPACITY (÷NUMBER OF PRODUCCTS LOADED) | 20 | #.####E+## | 0.00 | #.####E+## | 0.00 | #.####E+## | 0.00 |
| TOTAL | | | | | | 0 | | 0 | | 0 |

FIG. 6

④ USING STAGE

| INPUT MATERIAL NAME | UNIT | USAGE (ONCE) | LIFE (YEARS) | FREQ. OF USE (TIMES/DAY) | TOTAL | CO$_2$ | | SO$_X$ | | NO$_X$ | |
|---|---|---|---|---|---|---|---|---|---|---|---|
| | | | | | | UNIT LOAD EMISSION | AMOUNT OF EMISSION (g) | UNIT LOAD EMISSION | AMOUNT OF EMISSION (mg) | UNIT LOAD EMISSION | AMOUNT OF EMISSION (mg) |
| ELECTRICITY | KWH | | | | 0 | #.####E## | 0.00 | #.####E## | 0.00 | #.####E## | 0.00 |
| WATER | m$^3$ | | | | 0 | #.####E## | 0.00 | #.####E## | 0.00 | #.####E## | 0.00 |
| PAPER | m$^2$ | | | | 0 | #.####E## | 0.00 | #.####E## | 0.00 | #.####E## | 0.00 |
| BATTERY | NUMBER | | | | 0 | #.####E## | 0.00 | #.####E## | 0.00 | #.####E## | 0.00 |
| DETERGENT | g | | | | 0 | #.####E## | 0.00 | #.####E## | 0.00 | #.####E## | 0.00 |
| TOTAL | | | | | | | 0 | | 0 | | 0 |

F I G. 7

⑤ WASTE TREATMENT STAGE

| | ITEM | UNIT | CONDITION | INPUT AMOUNT | CO2 UNIT LOAD EMISSION | CO2 AMOUNT OF EMISSION (g) | SOx UNIT LOAD EMISSION | SOx AMOUNT OF EMISSION (g) | NOx UNIT LOAD EMISSION | NOx AMOUNT OF EMISSION (g) |
|---|---|---|---|---|---|---|---|---|---|---|
| | WASTE WEIGHT | g | SUM OF INPUT MATERIALS (REPRINTED FROM (FIG. 4)) | 0 | #.####E+## | 0.00 | #.####E+## | 0.00 | #.####E+## | 0.00 |
| TRANSPORT | COLLECTION → SIZE REDUCTION SITE | g | 4-ton trucks LOADED TO 60% CAPACITY, 20-KM TRANSPORT | 0 | #.####E+## | 0.00 | #.####E+## | 0.00 | #.####E+## | 0.00 |
| | SIZE REDUCTION SITE (ELECTRIC POWER) | g | | 0 | #.####E+## | 0.00 | #.####E+## | 0.00 | #.####E+## | 0.00 |
| | SIZE REDUCTION SITE (LIGHT OIL) | g | | 0 | #.####E+## | 0.00 | #.####E+## | 0.00 | #.####E+## | 0.00 |
| TRANSPORT | SIZE REDUCTION SITE → RECYCLING FACILITIES | g | 20-ton trucks LOADED TO 60% CAPACITY, 40-KM TRANSPORT | 0 | #.####E+## | 0.00 | #.####E+## | 0.00 | #.####E+## | 0.00 |
| TRANSPORT | SIZE REDUCTION SITE → FINAL DISPOSAL PLANT | g | 10-ton trucks LOADED TO 60% CAPACITY, 10-KM TRANSPORT | 0 | #.####E+## | 0.00 | #.####E+## | 0.00 | #.####E+## | 0.00 |
| | INCINERATION DUST COLLECTION | g | INCINERATION RATIO OF 42.3% | 0 | #.####E+## | 0.00 | #.####E+## | 0.00 | #.####E+## | 0.00 |
| | INCINERATION (RESIN) | g | POLYPROPYLENE CARBON RATIO 85.7%∗ (44/12) | 0 | #.####E+## | 0.00 | | | | |
| | INCINERATION (FIBER) | g | EXCLUDING RECYCLING COMPONENT. PAPER'S CARBON RATIO 44% ∗(44/12) | 0 | #.####E+## | 0.00 | | | | |
| | INCINERATION (INPUT ENERGY) | g | INCINERATION RATIO OF 42.3% | 0 | #.####E+## | 0.00 | #.####E+## | 0.00 | #.####E+## | 0.00 |
| | FLY ASH CARRYING OUT | g | 14.0% OF AMOUNT OF INCINERATION | 0 | #.####E+## | 0.00 | #.####E+## | 0.00 | #.####E+## | 0.00 |
| | FILLING-IN DISPOSAL | g | FILLING-IN RATIO 57.7% + INCINERATION ASH 14% | 0 | #.####E+## | 0.00 | #.####E+## | 0.00 | #.####E+## | 0.00 |
| | TOTAL | | | | | 0 | | 0 | | 0 |

FIG. 8

⑥. RECYCLING STAGE

| ITEM | UNIT | CONDITION | INPUT AMOUNT | COLLECTION RATE | AMOUNT OF COLLECTION | REDUCTION RATE | RECYCLING (AMOUNT OF REDUCTION) | CO₂ | | SOₓ | | NOₓ | |
|---|---|---|---|---|---|---|---|---|---|---|---|---|---|
| | | | | | | | | UNIT LOAD EMISSION | AMOUNT OF EMISSION (g) | UNIT LOAD EMISSION | AMOUNT OF EMISSION (mg) | UNIT LOAD EMISSION | AMOUNT OF EMISSION (mg) |
| IRON | g | AMOUNT OF IRON BOLTS... RECYCLED | 0 | 97.4% | 0 | 65.0% | 0 | -#.####E+## | -0.00 | -#.####E+## | -0.00 | -#.####E+## | -0.00 |
| ALUMINUM | g | AMOUNT OF ALUMINUM RECYCLED | 0 | 36.4% | 0 | 97.0% | 0 | -#.####E+## | -0.00 | -#.####E+## | -0.00 | -#.####E+## | -0.00 |
| COPPER | g | COPPER + ELECTRIC WIRE {m} *20 [g] | 0 | 36.4% | 0 | 90.0% | 0 | -#.####E+## | -0.00 | -#.####E+## | -0.00 | -#.####E+## | -0.00 |
| PAPER | g | AMOUNT OF PRINTED MATTER PUBLICATION RECYCLED | 0 | 51.3% | 0 | 32.4% | 0 | -#.####E+## | -0.00 | -#.####E+## | -0.00 | -#.####E+## | -0.00 |
| CORRUGATED CARDBOARD | g | AMOUNT OF PAPER CORRUGATED CORDBOARD RECYCLED | 0 | 61.0% | 0 | 32.4% | 0 | -#.####E+## | -0.00 | -#.####E+## | -0.00 | -#.####E+## | -0.00 |
| TOTAL | | | 0 | — | 0 | — | 0 | | -0 | | -0 | | -0 |

FIG. 9

ENVIRONMENTAL LOAD SIMULATION IN RECYCLING CATHODE-RAY TUBE GLASS OF COLOR TV

| ITEM | AMOUNT OF CO$_2$ EMISSION (g) | | AMOUNT OF SO$_X$ EMISSION (mg) | | AMOUNT OF NO$_X$ EMISSION (mg) | |
|---|---|---|---|---|---|---|
| MATERIAL ACQUISITION STAGE | *,* | 35.5% | * | 5.8% | *,*** | 26.3% |
| PRODUCTION STAGE | *** | 0.1% | ** | 0.0% | *** | 0.1% |
| DISTRIBUTION STAGE | *,*** | 1.4% | *,* | 46.3% | ,*** | 1.6% |
| USING STAGE | *,* | 59.7% | *,* | 8.8% | *,*** | 44.4% |
| WASTE TREATMENT STAGE | ,* | 4.7% | *,* | 39.3% | *,*** | 28.8% |
| RECYCLING STAGE | -*,* | -1.5% | - | -0.2% | -,* | -1.1% |
| TOTAL | *,* | 100% | ,* | 100% | *,*,* | 100% |

F I G. 1 1 A

RECYCLING RATE

| RECYCLABLE MATRIAL USE RATE | RECYCLING WEIGHT RATIO | CO$_2$ REDUCTION RATIO | SO$_X$ REDUCTION RATIO | NO$_X$ REDUCTION RATIO |
|---|---|---|---|---|
| 67.2% | 9.4% | 2.1% | 4.8% | 6.1% |

F I G. 1 1 B

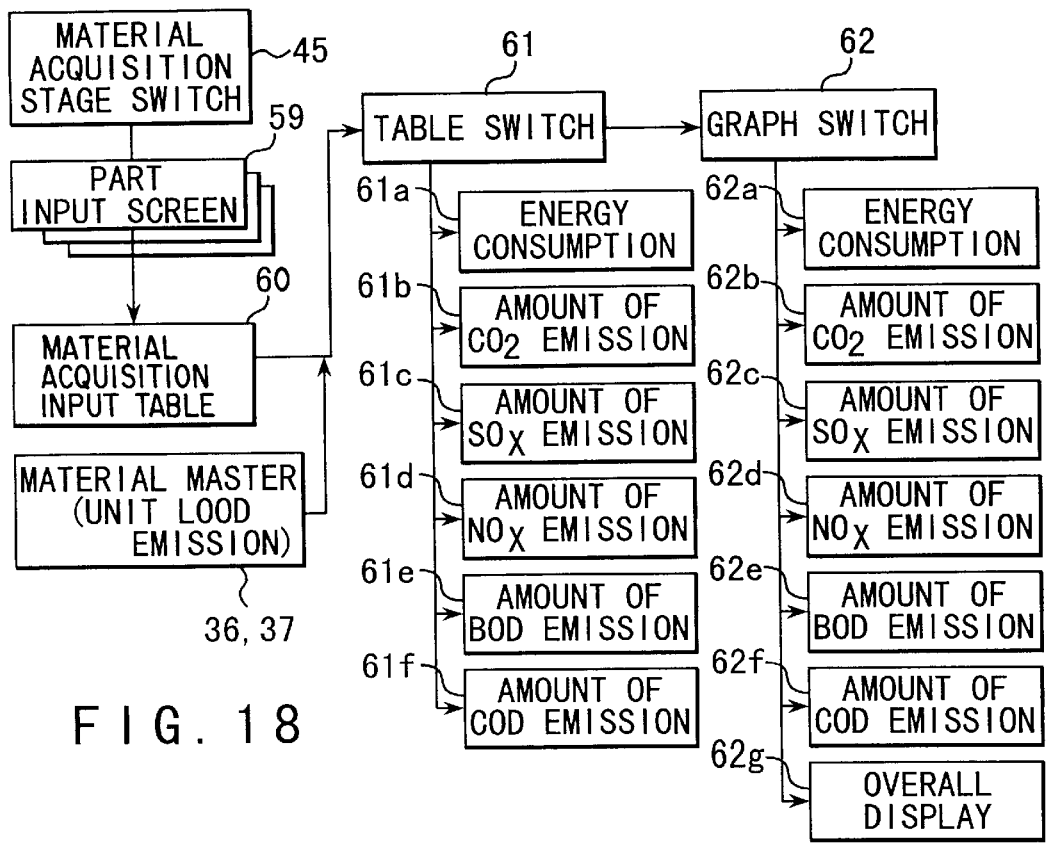
F I G. 1 8
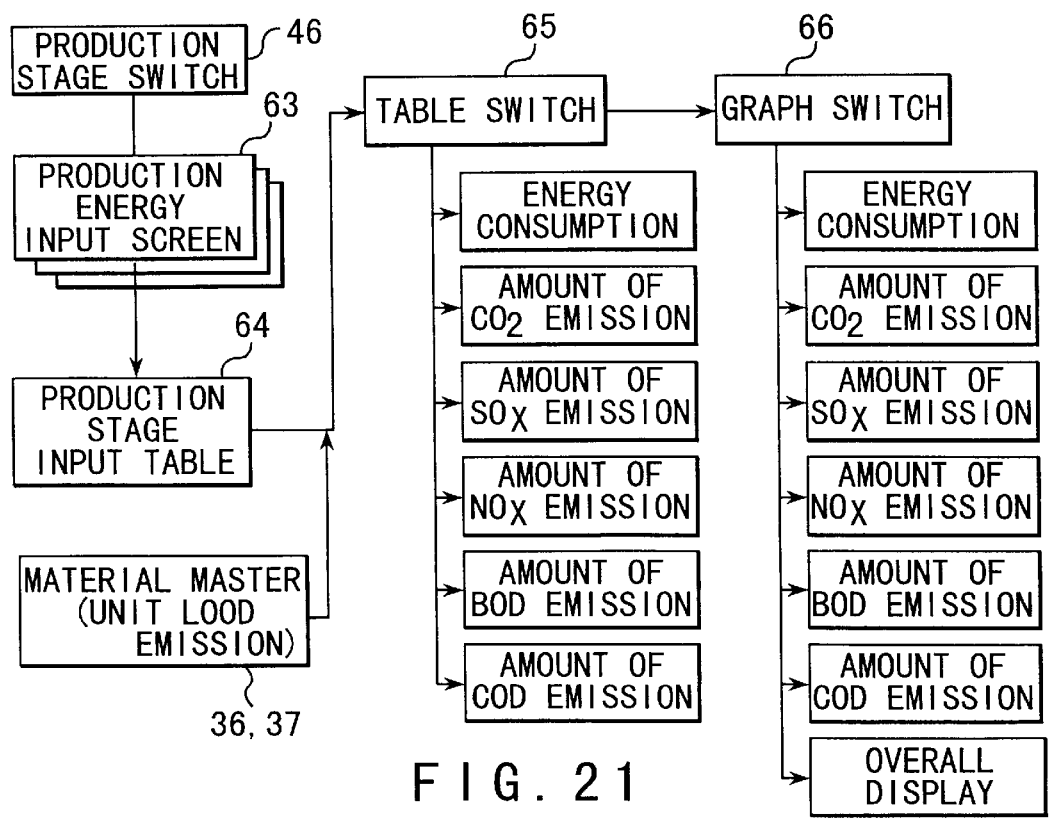
F I G. 2 1

MATERIAL ACQUISITION STAGE

MODEL NAME [AW-1234] PRODUCT NAME [WASHING MACHINE]

UNIT NAME [WASHTUB ▼]  REMARKS [____]
SUBUNIT NAME [SPIN-DRIER TUB ▼]  REMARKS [____]
PART NAME [SPIN-DRIER ▼]  REMARKS [____]

MATERIAL NAME [POLYPROPYLENE]

GENERAL CATEGORY [RESIN ▼]
MIDDLE CLASS [THERMOPLASTIC RESIN ▼]
MATERIAL NAME [POLYPROPYLENE ▼]

POLYSTYRENE
EXPANDED POLYSTYRENE
AS RESIN(ACRYLONITRILE-STYR
ABS RESIN(ACRYLONITRILE-BUT
FLUOROPLASTIC
POLYPROPYLENE
POLYVINYL CHLORIDE
GENERAL HIGH-PERFORMANCE RE
PET (POLYETHYLENE TEREPHTHL
OTHER SYNTHETIC RESIN

[MATERIAL NAME DECISION] — 60

AMOUNT [3300] [g]
PART TRANSPORT [☐]

[CLOSE]  [ENTER]  [CANCEL]  [RECORD DELETE]  61  [TABLE]  [GRAPH] — 62

PRODUCTION STAGE    MODEL NAME [AW-1234]    PRODUCT NAME [WASHING MACHINE]

STEP NAME [ASSEMBLY STEP ▼]

MATERIAL NAME [GENERAL ELECTRIC POWER FOR BUSINESS USE]    GENERAL CLASS [TYPE OF ENERGY ▼]

MIDDLE CLASS [ELECTRIC POWER ▼]

MATERIAL NAME [GENERAL ELECTRIC POWER FOR BUSINESS USE ▼]    [MATERIAL NAME DECISION]

GENERAL ELECTRIC POWER
GENERAL ELECTRIC POWER
NUCLEAR ELECTRIC POWER GENERATION FOR BUSINES
THERMAL POWER GENERATI
HYDROELECTRIC POWER GE
AND OTHERS FOR BUSINES
PRIVATE ELECTRIC GENER

AMOUNT [13.345] kWh

WASTE ☐

[DECIDE] [CANCEL] [RECORD DELETE] [TABLE]—65 [GRAPH]—66

[CLOSE]

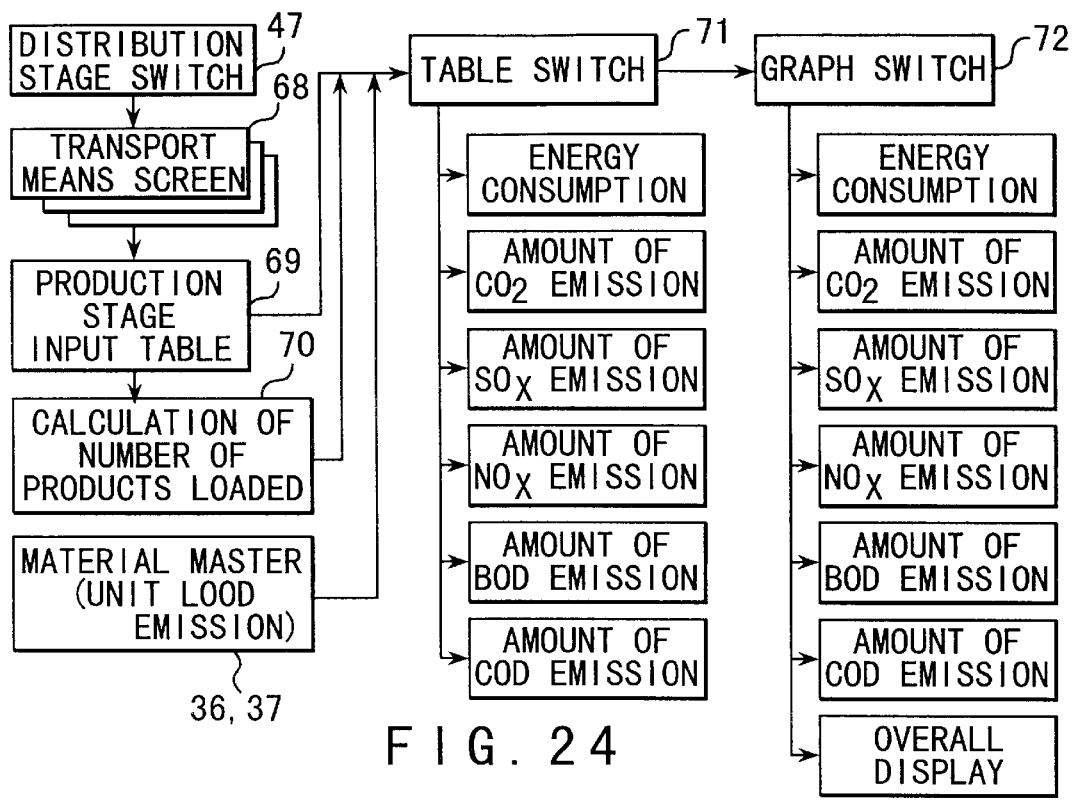
F I G. 2 4
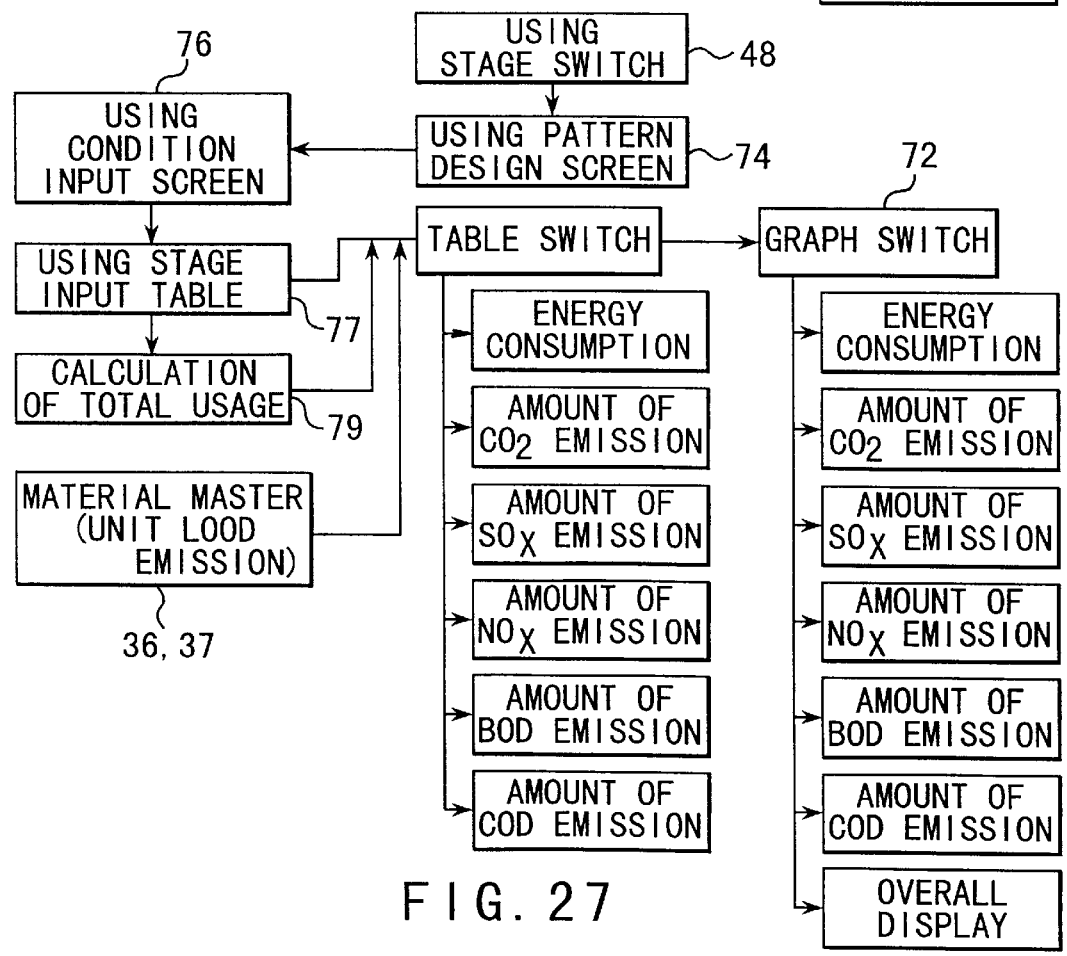
F I G. 2 7

FIG. 25

DISTRIBUTION STAGE  MODEL NAME [AW-1234]  PRODUCT NAME [WASHING MACHINE]

TRANSPORT NAME       [FACTORY SHIPMENT ▼]
TRANSPORT METHOD     [10-ton trucks ▼]
FUEL NAME            [LIGHT OIL]
LOADING CONDITION    NUMBER OF PRODUCTS LOADED

[84] UNITS

CALCULATING NUMBER OF PRODUCTS LOADED

PACKAGE CAPACITY  [0.437673215] m³
LENGTH            [0.941] m
WIDTH             [0.679] m
HEIGHT            [0.685] m

TRANSPORT DISTANCE [364.1] Km

[CLOSE]  [NEW]  [UPDATE]  [CANCEL]  [RECORD DELETE]  [TABLE]  [GRAPH]

F I G. 2 8

USING STAGE    MODEL NAME [AW-1234]    PRODUCT NAME [WASHING MACHINE]

USING PATTERN [ONE ▶]

PATTERN CATEGORY [NUMBER OF TIMES USE ▶]
[NUMBER OF TIMES USE ◀ ▶]
TIME USE
REPLACEMENT/MAINTENANCE

75

[INPUT] [CANCEL]

[TABLE] [GRAPH]

[CLOSE]

FIG. 29

| MODEL NAME | AW-1234 | | PRODUCT NAME | WASHING MACHINE |
|---|---|---|---|---|
| USING PATTERN | ONE | | PATTERN CATEGORY | NUMBER OF TIMES USE |

PATTERN 1

PATTERN RATE [100] %

CATEGORY NAME [ORDINARY HOME ▼]

MATERIAL NAME [WATERWORKS & GENERAL SMALL WATER-SUPPLY SYSTERM ▼]

UNIT [m³] TIME

USAGE [0.179]

FREQ. OF USE [1] TIMES/DAY

DAYS OF USE [365] DAYS/YEAR

PERIOD OF USE [9] YEAR

WASTE ☐

[NEW] [UPDATE]   [RECORD DELETE]

[UPDATE]

[RETURN]

WASTE TREATMENT & RECYCLING STAGE

MODEL NAME [WASHING MASHINE] PRODUCT NAME [AW-1234]

PRODUCT WEIGHT [41472.62] g

RECYCLING RATIO → RECYCLING REDUCTION RATIO SETTING

COLLECTION RATIO SETTING

| | |
|---|---|
| IRON | [97.4] % |
| COPPER | [36.4] % |
| ALUMINUM | [36.4] % |
| PAPER | [51.3] % |
| CORRUGATED CARDBOARD | [61.6] % |
| GLASS | [10.0] % |

[ENTER]

TRANSPORT 1 [4-ton trucks ▼]
LOADING RATIO [60] %
DISTANCE [20] km

RECYCLING → [TABLE] [GRAPH]

→ [7.7] %  → FILLING-IN DISPOSAL

→ [14.4] % → INCINERATION DISPOSAL → FLY ASH

WASTE TREATMENT [TABLE] [GRAPH]

[CLOSE] [UPDATE] [CANCEL]

WASTE TREATMENT & RECYCLING STAGE

MODEL NAME: WASHING MASHINE    PRODUCT NAME: AW-1234

RESTORATION RATIO

PRODUCT WEIGHT: 41472.6 g

DISPOS...

TRANSPORT 1: 4-ton trucks
LOADING RATIO: 60 %
DISTANCE: 20 km

TRA...
LOA...
DIS...

RECYCLING REDUCTION RATIO SETTING

| | |
|---|---|
| IRON | 65 % |
| COPPER | 97 % |
| ALUMINUM | 90 % |
| PAPER | 32.4 % |
| CORRUGATED CARDBOARD | 32.4 % |
| GLASS | 40 % |

[ENTER]

RECYCLING
[TABLE]  [TABLE]

7.7 %
14.4 %

FILLING-IN DISPOSAL

INCINERATION DISPOSAL

FLY ASH

WASTE TREATMENT
[TABLE] [GRAPH]

[CLOSE] [UPDATE] [CANCEL]

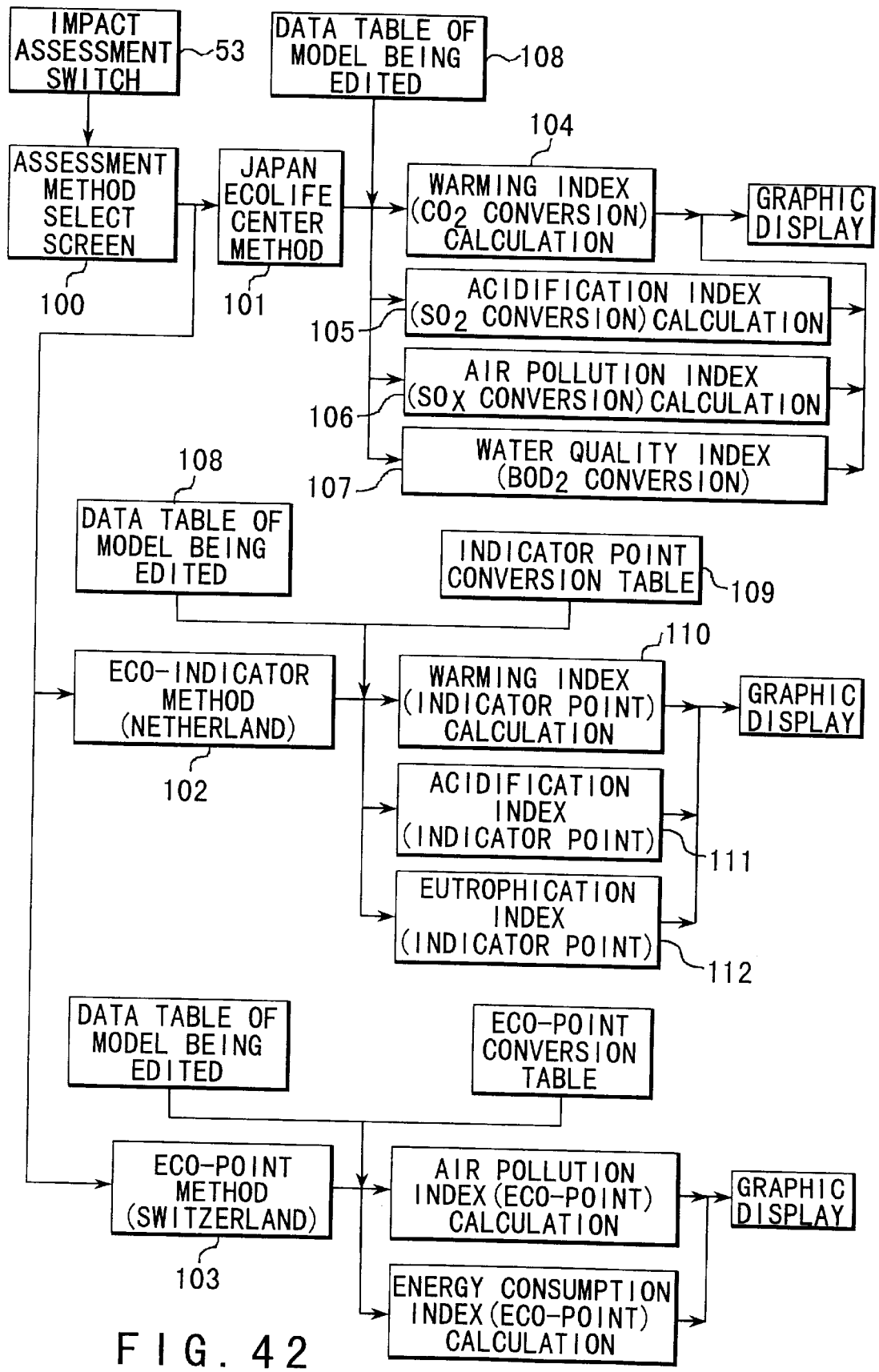
F I G. 42

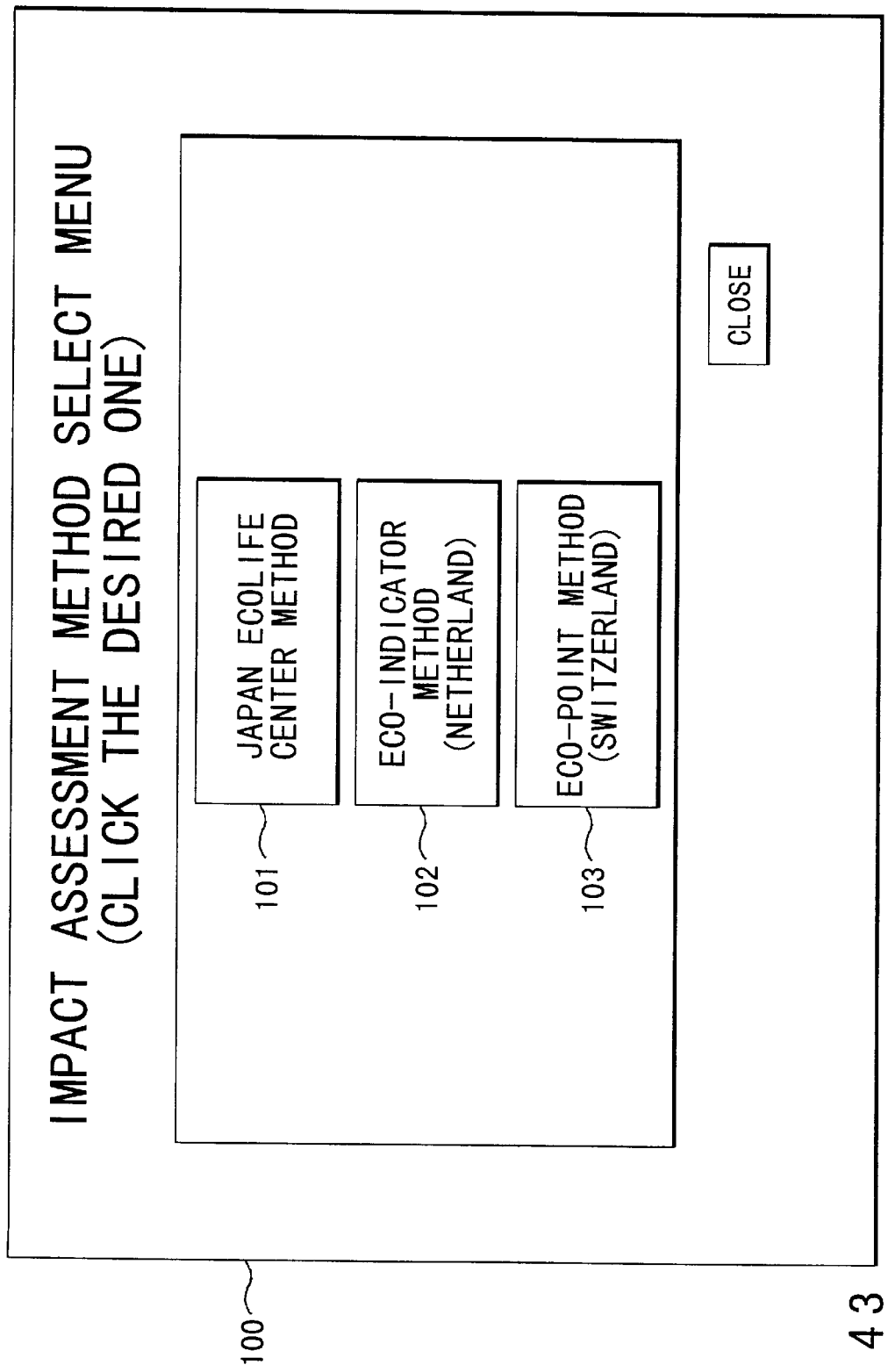
F I G. 43

APPARATUS FOR ASSESSING A LOAD THAT INDUSTRIAL PRODUCTS APPLY TO THE ENVIRONMENT

BACKGROUND OF THE INVENTION

This invention relates to an environmental load assessment apparatus capable of easily assessing an environmental load of industrial products.

With the increased public concern about environmental problems in recent years, not only consideration has been given to the effect of factory's production activities on the environment, but also a reduction in the load that products have applied to the environment has been required. In this connection, life cycle assessment (LCA) has been attracting attention. LCA is the approach of analyzing and evaluating the load that a product applies to the environment throughout its life and improving the product to reduce the load on the environment.

Namely, LCA is to grasp and assess an environmental load throughout the life cycle of a product (material acquisition→production→distribution→use→disposal/recycling).

LCA is characterized by evaluating the quality of a product throughout its life comprehensively, not partially, and by quantitatively grasping loads, including air pollution, resources efficiency, and the amount of waste, and putting the quantitative data to good use for scientific or efficient improvements.

One LCA technique has been disclosed in, for example, Jpn. Pat. Appln. KOKAI Publication No. 7-311760. The method of assessing an environmental load in the publication employs the technique of forming a detailed tree structure concerning the process of manufacturing a product to be evaluated and the process of disposing of the product, thereby clarifying the environmental load in all of the processes.

Such an assessment method, however, has the following drawbacks:

(1) The assessment is not completed unless the processes have been analyzed in detail throughout the whole life cycle of the product, so the assessment of a type of a product requires enormous time and a huge amount of labor.

(2) The introduction of the system needs a large-scale investment. Designers are required to make every effort to master the system.

When LCA is introduced and an environmental load is assessed, especially when the life cycle of a product whose development time is short, such as electric appliances is evaluated, a fast, simple assessment is needed. Conventional techniques cannot meet the requirement.

It is considered important to evaluate the environmental load regarding the product over the whole life cycle ranging from the production stage to the waste treatment stage or the recycling stage after the service life of the product has expired. Thus, the assessment method has been studied. In the case of the assessment of an environmental load by conventional approaches, an environmental load is examined for each of the component parts constituting a product to be evaluated in each stage of the life cycle, starting from the material acquisition stage. Then, the components parts are combined one by one to form the product. Thereafter, an environmental load is examined in each stage of the total life cycle of the product. Therefore, the problem is that it is very difficult to apply the assessment method to products whose life cycle is short and which have to be dealt with in a short time, because the assessment is not completed unless the processes have been analyzed in detail throughout the whole life cycle of the product, and therefore the assessment of a type of the product requires enormous time and a huge amount of labor, and because the introduction of the system needs a large-scale investment and designers are required to make every effort to master the system.

Since the number of and types of electric appliances are enormous and the proportion of them in the environmental load is large, evaluation by LCA is important. It is necessary to force the assessment results to be reflected in actual improvements in the product by looking into what environmental load exists in which stage of the life cycle of the product, what should be improved in which stage to reduce the environmental load, and others. This approach, however, is not suitable for the assessment of the life cycle of short-development-time products, such as electronic appliances, in the design stages.

Therefore, there have been demands in the field of short-development-time products, such as electric appliances, for the development of a system that enables fast, easy assessment and is suitable for life cycle assessment in the design stages.

BRIEF SUMMARY OF THE INVENTION

The object of the present invention is to provide an environmental load assessment apparatus capable of evaluating a load that a product applies to the environment, fast and easily by LCA.

To accomplish the object, the present invention comprises: an environmental load equation storage section that stores the environmental load equations modeled on a stage at which a product is produced and used and a stage of waste treatment and recycling, with the life cycle of the product being divided into at least the two stages; a conversion coefficient storage section that stores conversion coefficients used to convert the amounts of materials and energy consumed in producing, using, waste-treating, and recycling the product into the amount of environmental load factors emitted as a result of those operations; an input section for entering the amounts of materials and energy consumed in producing, using, waste-treating, and recycling the product, for each of the modeled stages; a computing section that calculates the amount of emission of environmental load factors by applying the amounts of materials and energy fed and the conversion coefficients corresponding to the amounts to the environmental load equations; an assessment section for assessing a load that the product applies to the environment on the basis of the calculation result; and an output section that outputs the assessment result.

The present invention aims to make LCA analysis versatile by modeling the life cycle of an industrial product and setting up an environmental load equation. In original LCA analysis, or full-scale LCA analysis, after each part of raw materials is traced back to its source and as many steps (processes) as there are tens of thousands of stages in total are clarified, the input/output at each step is investigated, the amount of emission of each environmental load factor, such as $CO_2$, $SO_x$, or $NO_x$, is picked up, and the environmental load is determined from the sum total. In contrast, with the present invention, the uniquely determined steps (e.g., trucking in the distribution stage and the input energy in the waste treatment stage) are modeled (standardized), whereas various materials, parts, and input energy that cannot be determined uniquely are not traced back to their sources and the conversion factors (unit load emissions) determined on the basis of reliable data are quoted.

After such standardization, only the source of unit load emission serving as a reference in calculation is important from the viewpoints of reliability and transparency. Therefore, in the present invention, for example, the data in the input-output tables for each country is used as reliable data. Because the input-output tables cover all of the far-reaching effects of the nation's supply and demand, use of the input-output tables results in the effect of tracing the product back to its source.

Use of such data and modeling makes the LCA analysis of products simple and easy, which enables LCA analysis to be applied to even electric appliances that have to be developed in a short period.

Additional objects advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 shows a calculation format in the material acquisition stage used in the system of the present invention;

FIG. 5 shows a calculation format in the production stage used in the system of the present invention;

FIG. 6 shows a calculation format in the distribution stage used in the system of the present invention;

FIG. 7 shows a calculation format in the using stage used in the system of the present invention;

FIG. 8 shows a calculation format in the waste treatment stage used in the system of the present invention;

FIG. 9 shows a calculation format in the recycling stage used in the system of the present invention;

FIGS. 11A and 11B show the calculation results of color TV based on LCA analysis using the system of the present invention;

FIG. 18 is a block diagram to help explain the processing at the material acquisition stage in the second embodiment;

FIG. 19 illustrates an example of the input screen at the material acquisition stage in the second embodiment;

FIG. 21 is a block diagram to help explain the processing at the production stage in the second embodiment;

FIG. 22 illustrates an example of the input screen at the production stage in the second embodiment;

FIG. 24 is a block diagram to help explain the processing at the distribution stage in the second embodiment;

FIG. 25 illustrates an example of the input screen at the distribution stage in the second embodiment;

FIG. 27 is a block diagram to help explain the processing at the using stage in the second embodiment;

FIG. 28 illustrates an example of the input screen at the using stage in the second embodiment;

FIG. 29 illustrates an example of the input screen at the using stage in the second embodiment;

FIG. 33 illustrates an example of the recovery rate setting screen in the waste treatment/recycling stages in the second embodiment;

FIG. 34 illustrates an example of the recycling restoration rate setting screen in the waste treatment/recycling stages in the second embodiment;

FIG. 42 is a block diagram to help explain the process of making an impact assessment in the second embodiment;

FIG. 43 illustrates an example of the input screen for impact assessment in the second embodiment;

DETAILED DESCRIPTION OF THE INVENTION

Hereinafter, referring to the accompanying drawings, embodiments of an environmental load assessment apparatus according to the present invention will be explained.

FIRST EMBODIMENT

Figure 1:
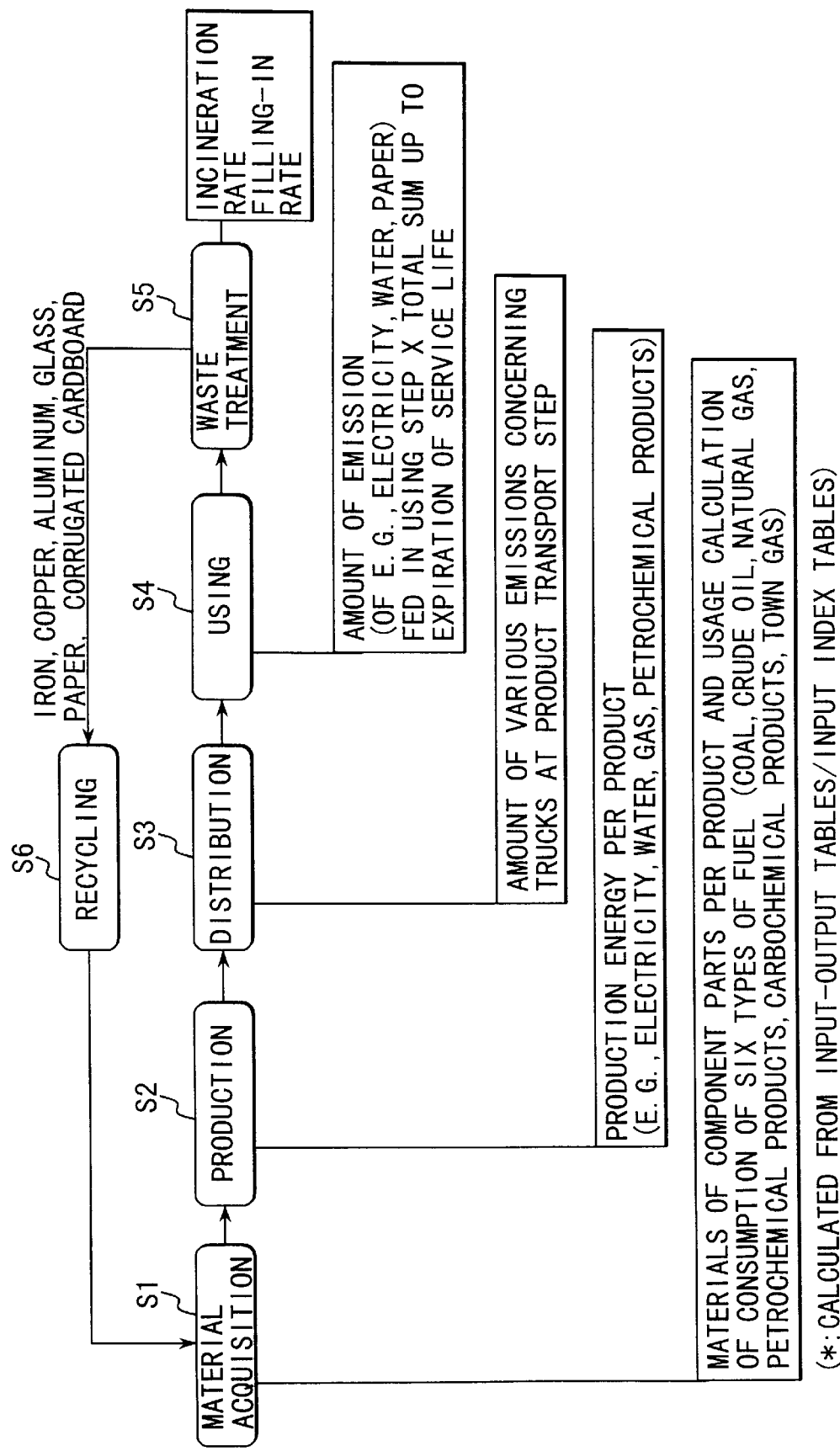
FIG. 1 is a processing flow diagram to help explain the overall structure of the life cycle of a modeled product in the present invention and the entered data items.

FIG. 1 shows a processing flow of a first embodiment of the present invention.

With an environmental load assessment apparatus of the first embodiment, the life cycle of a product is divided into stages S1 to S6 as shown in FIG. 1, the load the product applies to the environment is evaluated stage by stage, and the load the product applies to the environment throughout its life cycle is evaluated by adding up the result of each stage, Specifically, with the environmental load assessment apparatus, the life cycle of a product is divided into life stage S1 of material acquisition, life stage S2 of production, life stage S3 of distribution, life stage S4 at which the users use the product, life stage S5 of waste treatment after the expiration of the service life of the product, and life stage S6 of the recycling of discarded products. The reason why the recycling stage is taken into account is that the recycled materials are procured as raw materials again at the material acquisition stage.

With the present invention, each life stage is analyzed from the viewpoint of environmental loads and, on the basis of the analysis result, modeling is done, and then an environmental load equation is set up as a standard model for determining the load the product applies to the environment at each stage. At each stage, the values each determined for each of the component parts and materials of the product are substituted into the environmental load equation to determine the environmental load of the desired product. Unit load emissions obtained from input-output tables, which contain highly reliable statistical data items, are used as the values each determined for each of the component parts and materials of the product. Once the environmental load at each stage has been found, the environmental load of the product throughout its life cycle can be assessed on the basis of the sum of the emissions of environmental load factors in each life stage.

Unit load emission is defined as the amount of emission of a factor (e.g., $CO_2$, $SO_x$, or $NO_x$) that applies a load to the environment, per unit of an input material. That is, unit load emission is defined as the amount of emission of an environmental load factor per g for metal or plastic, per $m^2$ for paper, and per kWh for electric power. In principle, the amount of emission can be calculated by multiplying the unit load emission by the amount of (the usage of) input material. Therefore, if the unit load emission is obtained in advance for each of various materials, it may be used as a conversion factor that enables the unit usage (e.g., g) of each material to be converted into the amount (g) of emission of $CO_2$ ($SO_x$ or $NO_x$).

Hereinafter, a detailed explanation will be given.

FIG. 1 shows life stages S1 to S6 and the data items substituted into the formats (environmental load equations) used to calculate the environmental load at each stage. By applying the materials used or materials emitted in the individual data items, together with the unit load emissions, to the environmental load equations, the amount of $CO_2$ (carbon dioxide) emission, that of $SO_x$ (sulfur oxide) emission, and that of $NO_x$ (nitrogen oxide) emission acting as environmental load factors are calculated.

Hereinafter, the individual stages, that is, [1] material acquisition stage (S1), [2] production stage (S2), [3] distribution stage (S3), [4] using stage (S4), [5] waste treatment stage (S5), and [6] recycling stage (S6) will be explained in order in terms of concept and calculation method.

The present invention aims at making particular flows (FIG. 1 and FIG. 3) represent the life cycle of a product. In a conventional LCA analysis, after each part of raw materials is traced back to its source and as many steps (processes) as there are tens of thousands of stages in total are clarified, the input/output at each step is investigated, the amount of emission of each of typical environmental pollutants, including $CO_2$, $SO_x$, and $NO_x$, is picked up, and the environmental load is determined from the sum total.

With the present invention, however, the uniquely determined steps (e.g., trucking in the distribution stage and the input energy in the waste treatment stage) are modeled (standardized or made versatile), whereas various materials, parts, and input energy that cannot be determined uniquely are not traced back to their sources and the amount of emission of environmental load factors are obtained using the unit load emissions obtained from reliable data.

After such standardization, only the source of the unit load emission is important from the viewpoints of the reliability and transparency of the data.

The data in the input-output tables is used as reliable data, for example. Because the input-output tables cover all of the far-reaching effects of the nation's supply and demand, use of the input-output tables results in the effect of tracing the product back to its source. The present invention is not limited to the use of the data in the input-output tables as reliable data. For instance, if unit load emissions are standardized in the industries, they may be used instead.

The input-output tables are the statistical materials the Prime Minister's Office issues every five years. The input-output tables represent the transfer (supply and demand) of money between the industrial sectors in one nation in matrix form. With the input-output tables, to produce one gram of steel, the amount of supply can be calculated in the form of some yen's worth of rice, some yen's worth of machine, some yen's worth of transportation, some yen's worth of oil, and some yen's worth of electric power. The calculated results cover all of the far-reaching effects in the nation, resulting in the effect of tracing the materials back to their sources.

Thus, for the amount of $CO_2$ emission, the source of $CO_2$ (whose molecular weight is 44) can be covered by finding how much fossil fuel has been supplied to produce the material (e.g., iron). Specifically, the usage of six types of fuel (coal, crude oil, natural gas, petrochemical products, carbochemical products, and town gas) is found and multiplied by each carbon content, thereby calculating $CO_2$ (multiplying a molecular weight of 44/12), considering that all of the carbon component (whose molecular weight is 12) have been consumed in combustion.

[1] Material Acquisition Stage (S1)

FIG. 4 shows a format of an example of the environmental load equation in the material acquisition stage.

In the format, the categories of material are written in the direction of row and the names (part name 1, part name 2, . . . ) of component parts of a product are entered in the direction of column. In the blank spaces, the usage of each relevant material is entered part by part.

On the right of the component part column, the sum of the usage of each material used is shown. By multiplying the usage by the unit load emission in the column on the right of the sum column, the amount of emission of the environmental load factors ($CO_2$, $SO_x$, $NO_x$) for each material is obtained.

Several tens of items in the 187 categories in the input-output tables are used as the categories of material.

What is obtained as follows is used as the unit load emission for each material. Specifically, the usage of six types of fossil fuel (coal, crude oil, natural gas, petrochemical products, carbochemical products, and town gas), which are the sources of emission of environmental load factors (including, $CO_2$, $SO_x$, and $NO_x$), is determined. Then, using the input-output table input coefficient table, an inverse matrix is calculated for the six types of fossil fuel, thereby founding the sum of the amounts of $CO_2$ (environmental load factor) environmental factor that the six types emit. The amount of $CO_2$ is the unit $CO_2$ emission per unit of the material.

Unit $SO_x$ emission and unit $NO_x$ emission (other environmental load factors) can be found using the already found unit $CO_2$ emission. Specifically, unit $SO_x$ and $NO_x$ emissions for each of the six types of fuel are quoted from statistical data. The sum of the products of unit $CO_2$ emission for the six types of fuel multiplied by $SO_x/CO_2$ or by $NO_x/CO_2$ is unit $SO_x$ emission and $NO_x$ emissions, respectively.

[2] Production Stage

FIG. 5 shows a calculation format at the production stage. Various types of energy, including electricity, gas, and water, fed per product to be analyzed and secondary materials are entered. When it is difficult to determine the amount of those types of energy fed per product to be analyzed, because the production energy is almost proportional to the production cost, the quotient of the total usage of each type of energy in a factory divided by the ratio of the sum of shipment per product to be analyzed to the total sum of shipment is the amount of energy fed per product to be analyzed.

The unit load emission for the production energy is calculated using an inverse matrix on the basis of the input-output table as in [1] (material acquisition stage).

Specifically, from the input-output tables, the amounts of the six types of fossil fuel (coal, crude oil, natural gas, petrochemical products, carbochemical products, and town gas) used to generate each type of energy are determined. Then, using the input-output table input coefficient table, an inverse matrix is calculated for the six types of fossil fuel, thereby founding the sum of the amounts of the environmental load factors ($CO_2$, $SO_x$, and $NO_x$) emitted by the six types of fossil fuel. The amount of the environmental load factor is the unit load emission per unit energy.

[3] Distribution Stage (S3)

FIG. 6 is a calculation format at the distribution stage. The source of emission in distribution is considered that it comes from fuel (light oil) for transport trucks. In the case of electric appliances, 10-t trucks are used to transport them from a factory to sales footholds all over the country and then 2-t trucks are used to transport them from the sales footholds to retail shops. The number of units of the products to be analyzed whose package capacity or loading volume has been determined is entered and the products are distributed to each truck.

The products of the distance from the factory to each shop multiplied by the physical distribution ratio of the foothold to all the footholds are totaled for all the footholds. The sum of the products thus obtained is entered as the average transport distance from the factory to the footholds. Because it is difficult to determine the transport distance from the footholds to the shops, the transport distance is assumed to be an average of 20 km.

The calculation result is determined to be the average transport distance of electric appliances. The product of the average transport distance multiplied -by unit $CO_2$, $SO_x$, and $NO_x$ emissions per unit total distance [km] of trucks is the amount of emission at the distribution stage. The unit load emission is determined from the statistical materials.

[4] Using Stage (S4)

FIG. 7 is a calculation format at the using stage. The usage of and the frequency of use of input materials, including electricity, water, and paper, and those of energy at the using stage per product and the average service life of the product are entered, thereby calculating the total usage in its life cycle.

The unit load emission is calculated using an inverse matrix based on the input-output tables.

[5][6] Waste Treatment and Recycling Stages (S5, S6)

FIG. 8 is a calculation format at the waste treatment stage. FIG. 9 is a calculation format at the recycling stage. In the case of analysis to be assumed a certain electric appliance, a model flow of the waste treatment/recycling stages of a product is set up on the basis of statistics on the disposal of electric appliances in the ordinance designated cities in Japan. From the model flow based on the disposal statistics, the amount of emission regarding each type of operating energy can be calculated.

Figure 3:
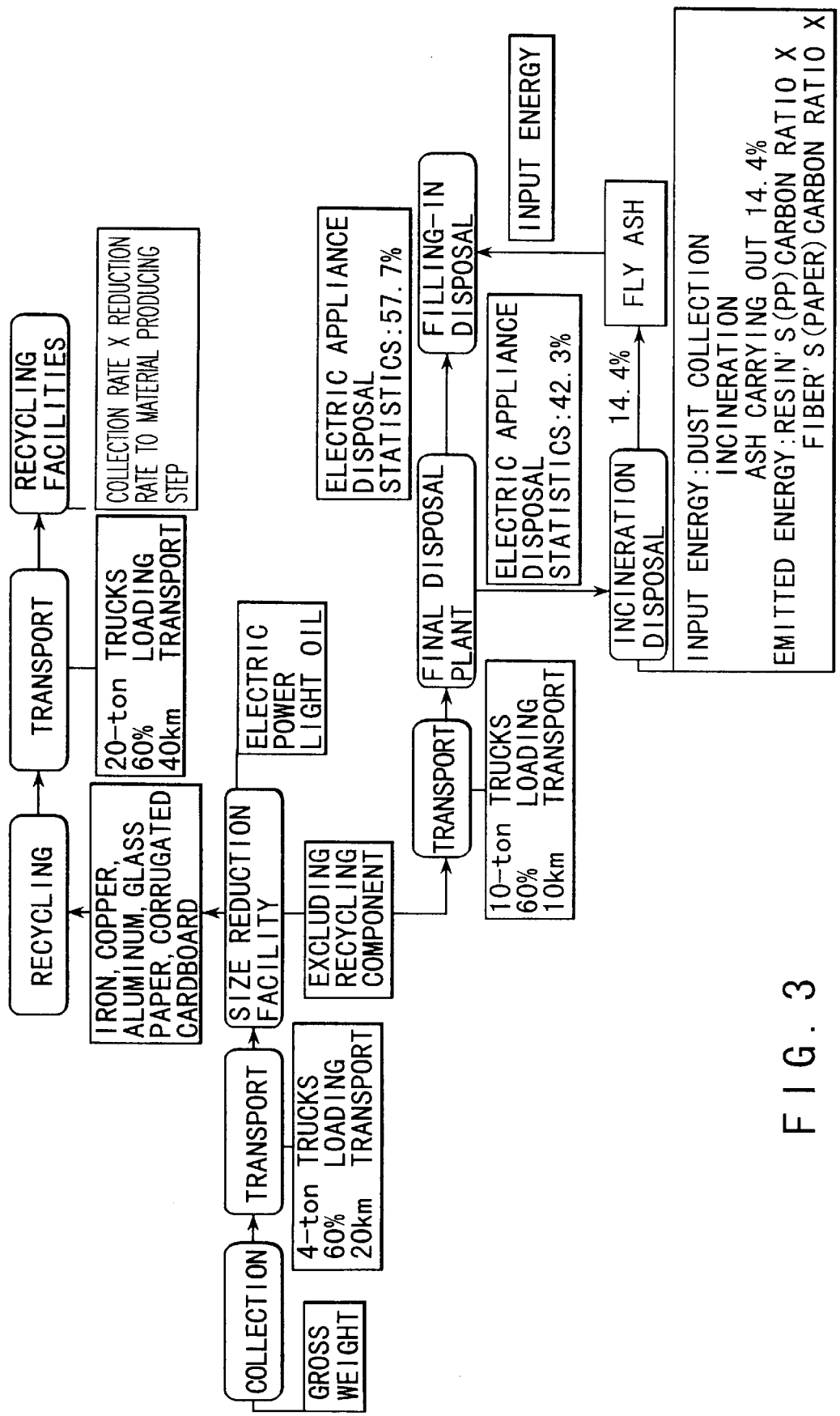
FIG. 3 is a flow diagram of the waste treatment and recycling step model according to the present invention.
Figure 10A:
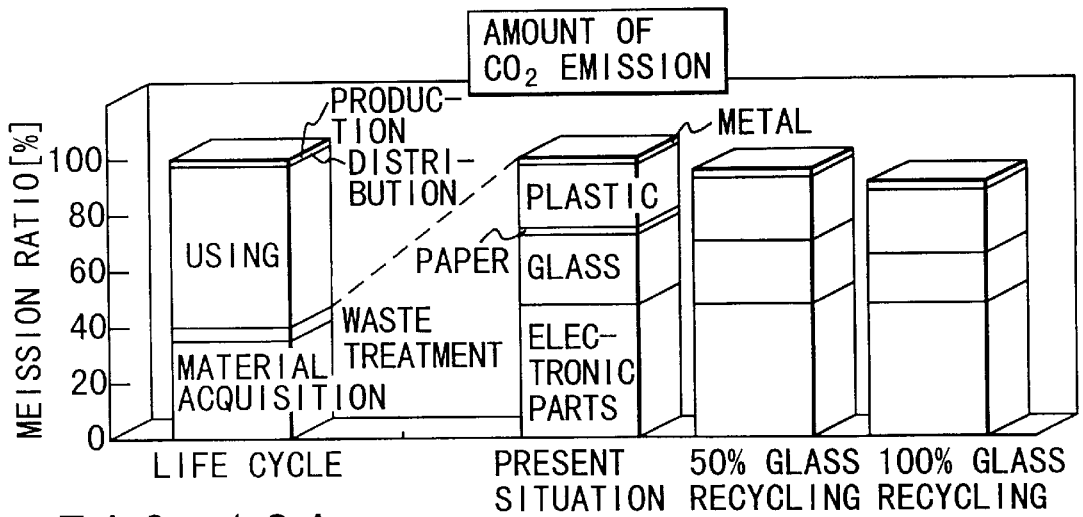
FIGS. 10A to 10C illustrate graphical representations obtained as the simulation results when the recycling rate is changed.
Figure 10B:
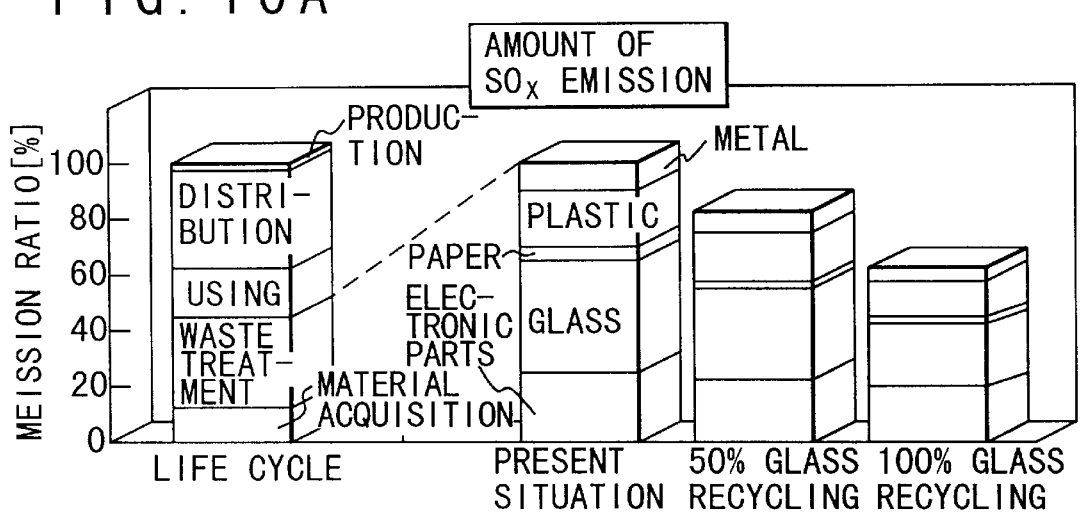
Figure 10C:
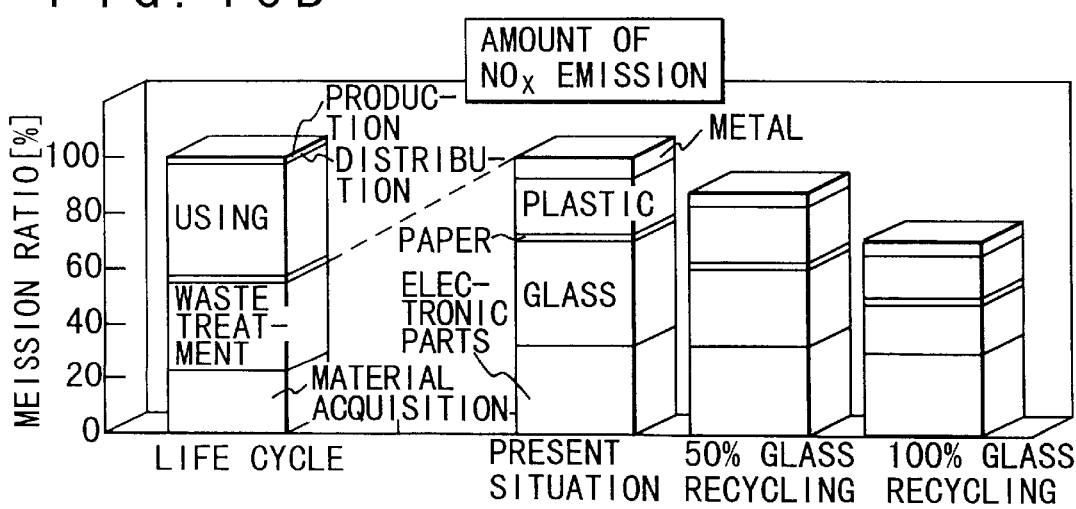

FIG. 3 shows a model flow in the waste treatment and recycling steps and calculation conditions in the present embodiment.

First, discarded electric appliances are collected by a collector, who carries them to an intermediate treatment step. The emission of environmental load factors at this stage arises from the fuel consumption and exhaust of the truck transport means. In the intermediate treatment step, the product is dismantled into recycling materials and unrecycling materials. The emission of environmental load factors arises from the amount of energy needed for processing.

The recycling materials include iron, copper, aluminum, paper, corrugated cardboard, and glass. These recycling materials are carried by transport means to the recycling facilities. At this time, too, the emission of environmental load factors arising from the transport means is considered. In the recycling facilities, the rate at which the recycling materials are used again as raw materials for products, that is, the restoration rate, is considered. Because the raw materials to be reused help reduce environmental load factors at the material acquisition stage S1, they are represented as negative.

In actual calculations, the amount used at the material acquisition stage is used directly as the input amount of each recycling material. The amount of reduction by recycling is found by multiplying the input amount by the recovery rate and restoration rate. The amounts of reduction thus obtained are multiplied by the unit load emissions, thereby determining the amounts of environmental load factors with the negative sign.

Each recovery rate and energy restoration rate have the initial values obtained from suitable literature. When the recovery rate is changed arbitrarily, for example, the corresponding environmental load can be simulated.

The amount of emission of environmental load factors arising from the transport means and the environmental load factors emitted in discarding materials other than the recycling materials are calculated as positive factors according to the format shown in FIG. 8.

Until now, the concept of the basic model for calculating environmental loads at each life stage of the life cycle of products has been explained. With the present invention, the system is constructed as shown in FIG. 2 to realize an LCA analysis process.

Figure 2:
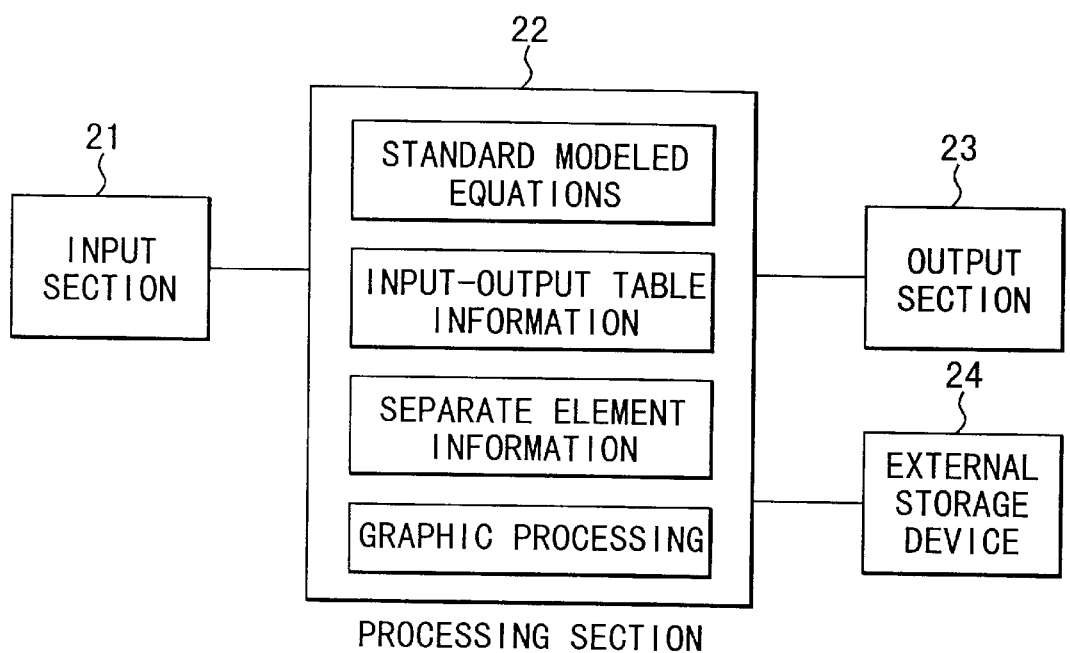
FIG. 2 is a schematic block diagram of a system according to a first embodiment of the present invention.

In FIG. 2, numeral 21 indicates an input section, 22 a processing section, 23 an output section, and 24 an external storage device. The input section 21 is used to input the necessary information. The processing section 22 has the environmental load equations modeled on the individual stages mentioned above. The environmental load equations have the function of calculating the necessary elements using the unit load emissions obtained from the input-output table information. The processing section 22 has the information holding function of storing pieces of the necessary information, including the separate component parts of the products to be evaluated necessary for calculation at each stage, the materials of the parts, the usage of the parts, the manufacturing energy (e.g., electricity, water, gas, petrochemical products), the incineration rate, and the filling-in rate, all of these inputted by the operator from the input section 21. The processing section also has the graphic processing function of the various types of information obtained by calculations.

Furthermore, the processing section 22 has the function of causing various screens to appear on the output section 23, the various screens including a necessary item entry screen, an editing screen, and a menu screen, which help the operator to enter the necessary data items for the calculation of environmental loads.

The output section 23 displays various screens obtained after the processing of the processing section 22. In general, the output section corresponds to a display. Besides a display, the output section 23 may be a hard copy output device, such as a printer, or a combination of a hard copy device and a display. The external storage device 24 is a large capacity storage device, such as a hard disk or an optical disk, that stores the necessary information and the processing results.

With the system thus constructed, when the operator gives an analysis start instruction from the input section 21 to the processing section 22, the processing section 22 requests the operator to specify which product is to be analyzed. Then, the operator enters the name of a product to be analyzed from the input section 21.

According to the product name, the processing section 22 selects the necessary information concerning the relevant product from the input-output tables. Then, the processing section forces the screen that prompts the user to enter the data necessary for calculations to appear on the output section 23 according to each life stage. The operator, according to the request, enters the data necessary for the analysis of the product to be analyzed from the input section 21.

For instance, at the material acquisition stage, the operator enters the materials of the component parts per product and the usage of the materials per product.

For the other necessary data items in each life stage, the processing section 22 automatically selects and extracts them from the input-output tables, the other necessary data items including the consumption of six types of fuel (coal, crude oil, natural gas, petrochemical products, carbochemical products, and town gas) at the material acquisition state, the necessary manufacturing energy (e.g., electricity, water, gas, and petrochemical products) per product at the production stage, the truck transport distance in the product transport process at the distribution stage, and the total sum of electricity, water, and paper fed in the using process during the service life of the product.

On the basis of those data items, the necessary unit load emissions are determined. The environmental load at each stage is calculated using the standard modeled equation on the basis of the determined unit load emissions and the various data items the operator has entered. Moreover, the total sum of environmental loads throughout the life cycle is found. The necessary information including the calculated data items is filed and stored in the external storage device 24.

Then, the calculated data items are displayed on the output section 23. When the operator gives an instruction to provide graphic representation from the input section 21, the processing section 22 performs the graphic processing of the obtained data items according to the instruction and displays the result on the output section 23.

With the present invention, the rough structure of environmental loads in the uniquely determined steps, that is, at each life stage of the life cycle, is modeled, and the thus obtained model is applied to any product. Namely, an equation for a standard model for each life stage is prepared and the environmental load is calculated using the equation.

As described above, those modeled on the rough structure of environmental loads at each life stage, for example, the standardizable and versatile portions (e.g., trucking at the distribution stage and the input energy at the waste treatment stage), are modeled (standardized or made versatile) for simplification, whereas various materials, parts, and input energy that cannot be standardized because they differ product by product are not traced back to their sources as found in the prior art. In the present invention, the quoted reliable data items are used in place of the ones that are not traced back.

After such standardization, only the sources of unit load emissions are important from the viewpoints of the reliability and transparency of the data. The reliability and transparency of the analysis results can be secured by the conversion of the data in the highly reliable input-output tables. The operator has only to enter the product name, the component parts of the product, the number of the parts, and the amount of emission of electricity, water, and paper at the using stage, and the like. Therefore, even in the case of a product with a short development period, it is very easy to apply LCA analysis to the product from its development stages. This makes it possible to determine at which stage the environmental load should be reduced to produce a greater effect from the viewpoint of the reduction of environmental load, and therefore develop a better product. Thus, the effect of the present invention is very large.

Next, a concrete application of the present system will be explained.

The operation of the system constructed as described above will be described by reference to FIGS. 10A to 14. A case where a color TV is specified as a product will be explained.

Example of Calculation (in the case of a color TV)

An example of calculating environmental loads in the case of a color TV will be explained concretely. The calculation of the amount of $CO_2$ emission as an environmental load will be explained. The same holds true for $SO_x$ and $NO_x$.

[1] Material Acquisition Stage

At the material acquisition stage, the parts used and component materials are specified. In the case of a color TV, the part names include frame, PC board assembly, chassis, and CRT. The parts used are divided into these parts and the component materials are determined.

The result shows that 5.4 kg of steel has been used for the entire product. The product of 5.4 kg multiplied by a unit $CO_2$ emission of 1.09 $gCO_2/g$ of steel obtained from the input-output tables, that is, 5.9 kg, is the amount of $CO_2$ emission of steel parts per product. The sum of the amounts of $CO_2$ emission in the individual categories is 137 kg, thereby calculating the amount of $CO_2$ emission at the material acquisition stage.

[2] Production Stage

At the production stage, a breakdown is written by input energy. Namely, the input energy per product in an assembly plant is found. The sum is 3.4 kW. The product of 3.4 kW multiplied by $1.17\times10^2$ $gCO_2/kWh$ obtained from the input-output tables, that is, 396 g, is the amount of $CO_2$ emission arising from the input electric power. Summing up all the amounts for the individual types of energy gives 450 g, which is the amount of $CO_2$ emission at the production stage.

[3] Distribution Stage

At the distribution stage, 505 km obtained by weighted average, taking into account the physical distribution ratio from the factory to the physical distribution footholds, is inputted as the transport distance. The format has a column into which the package capacity is written. Using the package capacity, the number of products loaded on one 10-t truck (provided that the truck is loaded to 80% capacity) can be determined. In the case of a product for which the number of units of the product has been determined, the operator enters the number of units directly. In the case of the product of this type, 56 units are entered.

Then, the transport distance is divided by the number of units loaded. The quotient is multiplied by a unit $CO_2$ emission of $7.42\times10^2$ $gCO_2/km$ of a 10-t truck obtained from the values in literature, which gives 5.3 kg. Next, the distance from the footholds to shops is determined to be an average of 20 km. The average of 20 km is multiplied by a unit $CO_2$ emission of a 2-t truck, which gives 0.02 kg. Adding 0.02 kg to the 5.3 kg gives 5.4 kg, which is the amount of $CO_2$ emission at the distribution stage.

[4] Using Stage

At the using stage, taking into account the power consumption and average using time of a color TV, an electric power of 0.6 kWh is consumed in a day. An electric power of 1980 kWh is consumed in the life cycle, provided that the average service life is nine years. Then, the product of 1980 kWh multiplied by a unit load emission of $1.17\times10^2$ $g/kWh$ obtained from the input-output tables gives 231 kg, which is the amount of $CO_2$ emission at the using stage.

[5] Waste Treatment Stage

At the waste treatment stage, there is no input item because calculation is done using the input data at the material acquisition stage as it is.

A calculation method is determined by the flow of FIG. 3. Specifically, discarded electric appliances are collected by local governments or the like and are carried to an intermediate treatment plant over average distance of 20 km by 4-t trucks loaded to 60% capacity. The product of a gross weight of 60 kg multiplied by a unit load emission of $4.72\times10^2$ gives a $CO_2$ emission of 235 kg.

Because in the intermediate treatment plant, 6.5 g of $CO_2$ is emitted from an electric power per weight kg and 1.6 g of $CO_2$ is emitted from light oil per weight kg, the amounts of $CO_2$ emission are 390 g and 95 g, respectively.

Next, iron, copper, aluminum, glass, paper, corrugated cardboard, and the like are collected at the respective recovery rates. The collected recycling materials (a total of 11 kg) are carried to material recycling facilities over an average distance of 40 km by 20-t trucks loaded to 60% capacity. Namely, from a unit load emission of 1,180 $gCO_2/km$ of a 20-t truck, it is found that 42 g of $CO_2$ is emitted.

On the other hand, 49 kg of remains after the recovery of the recycling materials are carried to the final treatment plant over an average distance of 10 km by 10-t trucks loaded to 60% capacity. Namely, from a unit load emission of $7.42\times10^2$ of a 10-t truck, it is found that 61 g of $CO_2$ is emitted.

At the final treatment plant, on the basis of statistics on the disposal of electric appliances in the ordinance designated cities in Japan, 42.3% of the remains, or 21 kg of the remains are incinerated. From a unit load emission of $1.08\times10^2$ $gCO_{-2}/g$ concerning dirt collection and a unit load emission of $8.89\times10^2$ $gCO_{-2}/g$ regarding incineration, it is found that 223 g of $CO_2$ and 1428 g of $CO_2$ are emitted, respectively.

For direct emission of the carbon component by incineration, it is found from a unit load emission of 3.14 $gCO_2/g$ and a unit load emission of 1.61 $gCO_2/g$ obtained from the carbon content of plastic and paper that 13,266 g of $CO_2$ and 2,113 g of $CO_2$ are emitted.

The remains after incineration have an average weight of 6.9 kg, or 14.4%. To carry ash out, 34 g of $CO_2$ is estimated to be emitted, which is found from a unit load emission of $8.89\times10^{-2}$ $gCO_2/g$.

Then, 35.1 kg of the remains obtained by adding the incineration ash to 57.7% of the remains, the directly filled-in part based on the statistical materials, is filled in. From a unit load emission of $1.08\times10^2$ $gCO_{-2}/g$, it is found that a total of 380 g of $Co_2$ is emitted.

Thus, at the waste treatment stage, a total of 18.2 kg of $CO_2$ is emitted, including the loads regarding recycling work.

[6] Recycling Stage

At the recycling stage, for example, steel is recovered at a recovery rate of 97% and is fed again to an intermediate step in the material production steps. The proportion of the energy load reduced as a result of the input of the recycled material from the energy load required to produce the material from a 100% virgin material is known as the restoration rate. In the case of iron, 65% of iron contributes to load reduction.

Specifically, the input amount of iron (5.6 kg)×the recovery rate (97.4%)×the restoration rate (65%)=3.5 kg is the amount of load reduction. Then, the product of 3.5 kg multiplied by a unit load emission of 1.09 $gCO_2/g$ obtained from the iron input-output tables gives 3.8 kg, which is the amount of load reduction represented as negative with respect to the total amount of load.

Through [1] to [6], the amount of emission at each life stage is obtained in the form of composition ratio graphs as shown in FIGS. 12A to 14.

FIG. 11 is an embodiment of the results of doing calculations regarding a color TV as described above.

As a result of inputting data on a color TV according to FIGS. 4 to 9, the calculation results have been obtained as shown in FIGS. 11A and 11B. With the present system, a graphic processing based on these calculation results produces graphs as shown in FIGS. 12A to 14.

Figure 12A:
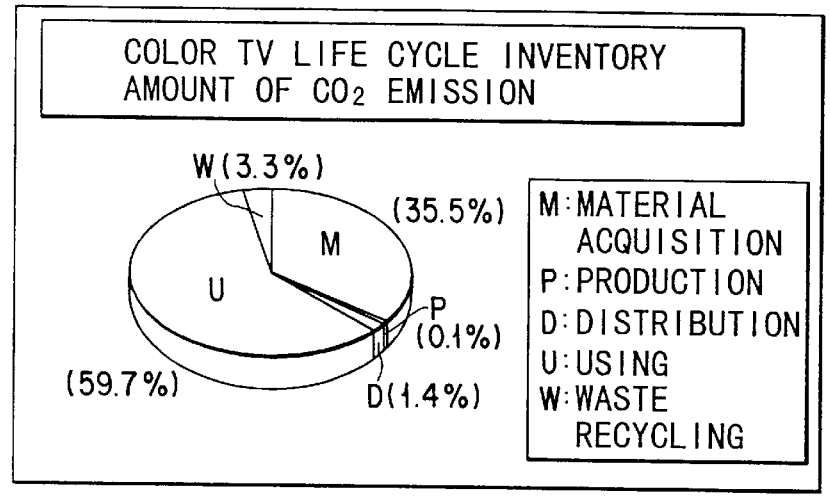
FIGS. 12A to 12C illustrate pie graph representations of the emission ratio of $CO_2$, $SO_x$ and $NO_x$ formed from the results of LCA analysis using the system of the present invention.
Figure 12B:
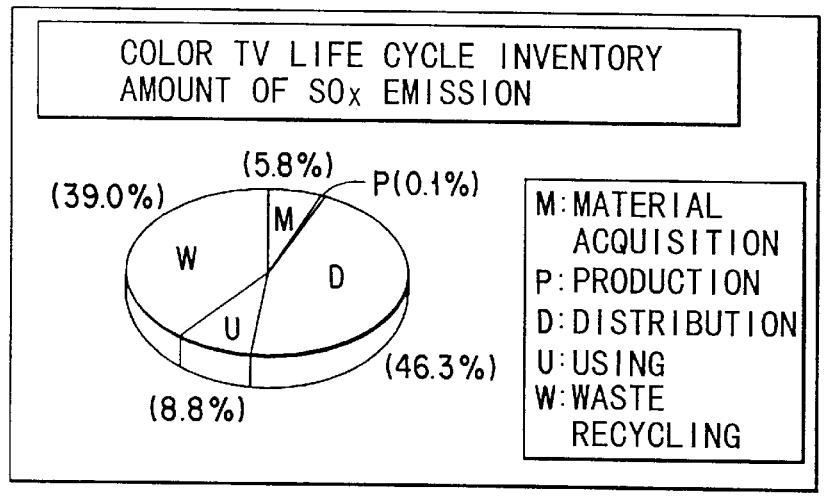
Figure 12C:
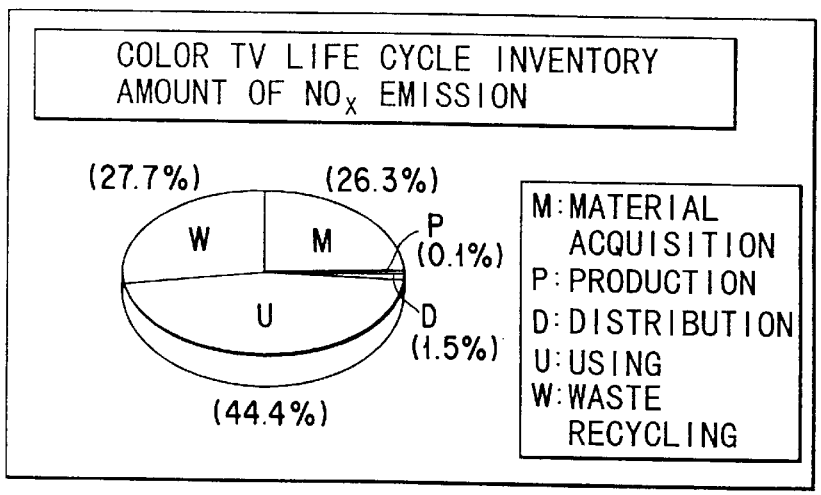
Figure 13A:
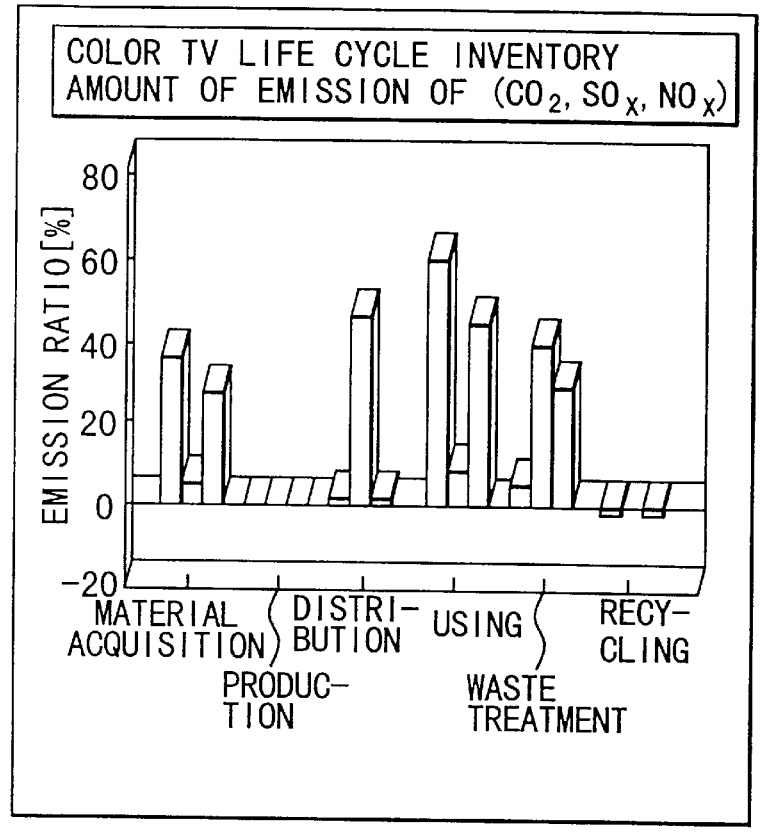
FIGS. 13A and 13B illustrate bar graph representations by life stage of three loads ($CO_2$, $SO_x$ and $NO_x$) and graphical representations of the ratio of three loads, both formed from the results of LCA analysis using the system of the present invention.
Figure 13B:
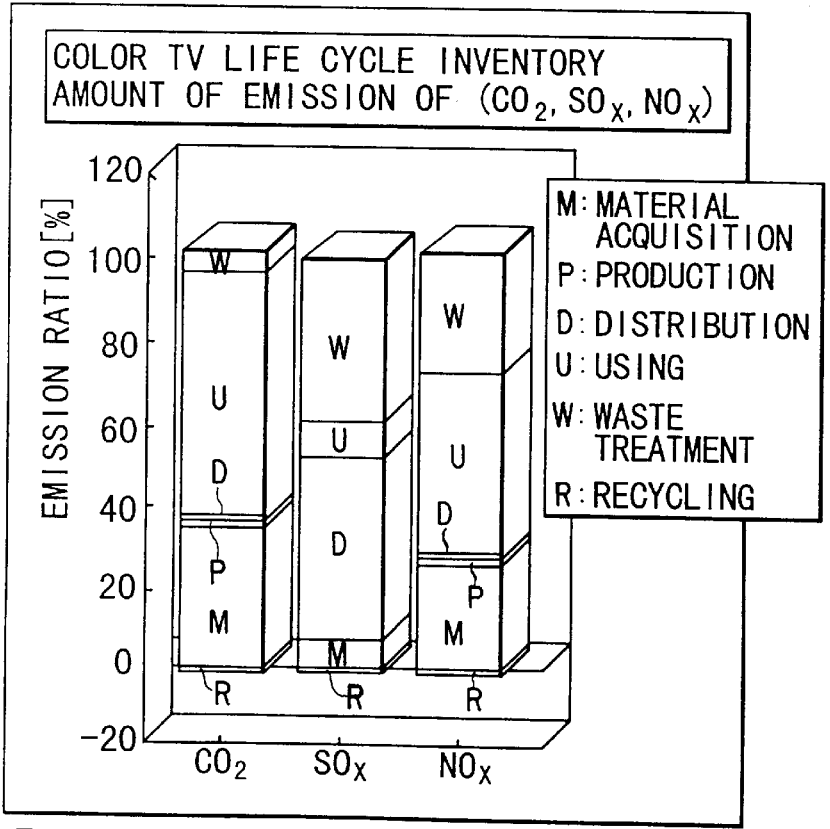

FIGS. 12A, 12B, and 12C are pie graphs of $CO_2$, $SO_x$, and $NO_x$ emission ratios, respectively. The resulting values in FIG. 11A are subjected to the graphic processing, thereby displaying the pie graphs on the output section 23. FIG. 13A is a bar graph where three loads are arranged by life stage. FIG. 13B is a graph where three loads ($CO_2$, $SO_x$, $NO_x$) are arranged by composition ratio.

Figure 14:
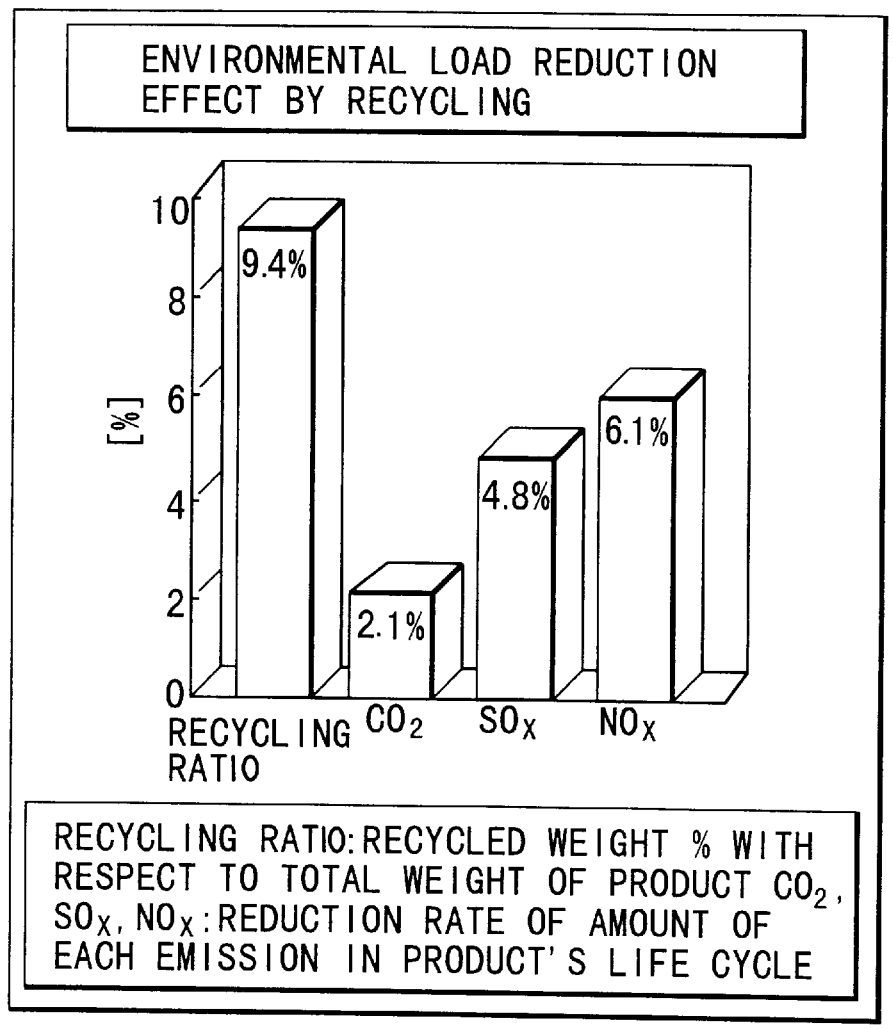
FIG. 14 illustrates a graphical representation by load of the environmental load reduction effect by recycling formed from the results of LCA analysis using the system of the present invention.

FIG. 14 is a bar graph of environmental load reduction effects in recycling by load. The resulting values in FIG. 11B are subjected to the graphic processing, thereby displaying the bar graph on the output section 23. Any graph is based on a calculation format. The person entering the data (in this case, the operator) can visually check a diagram of the data, while entering the data, or immediately see the resulting values. Therefore, the operator can see the analysis results easily, while checking the entered data.

From the above-described graphical representations, the operator can understand the weight of environmental load emission of each emission factor at a glance as follows:

(a) The $CO_2$ emission ratio is shown. The material acquisition stage occupies ⅓ of the entire life cycle and the using stage occupies 60% of the entire life cycle.

(b) The $SO_x$ emission ratio is shown. Each of the distribution stage and waste treatment stage occupies about 40% of the entire life cycle.

(c) The $NO_x$ emission ratio is shown. The using stage occupies about 50% of the entire life cycle.

Therefore, the operator can make improvements in load reduction in the subsequent design stages.

Furthermore, the operator can quantitatively understand the load reduction effect by recycling. Specifically, although the recovery rate and restoration rate at [5] the waste treatment stage and at [6] the recycling stage are fixed to the default values, how much of load can be reduced is known by changing the recovery rate and restoration rate.

For instance, the cathode-ray tube accounts for 51% of a color TV's weight of 60 kg. The amount of each emission is about 30%. Changing the recycling rate (recovery rate) of glass to 50% and 100% gives the graphs shown in FIGS. 10A, 10B, and 10C. From these graphs, the operator can directly see how the environmental loads are reduced.

The effect of reducing $SO_x$ and $NO_x$ is particularly large. It is found that 100% recycling causes the environmental load of glass to be halved.

Being useful in quantifying the load reduction at the waste treatment system of electric appliances, the present assessment method produces a great effect in terms of not only manufacturer but also social system.

A comparison of the method of the present invention with a conventional method will be explained.

A refrigerator is taken as example.

According to "Environment Control", Vol. 31, No. 7, pp91–97 (1995), the full-scale life cycle analysis results by a process analysis of refrigerators have been disclosed. The disclosed data has been compared with that obtained by the method of the present invention.

The table (Table1) below shows a comparison of the process analysis with the method of the present invention regarding refrigerators under Freon control. Because in the former, the material acquisition stage, production stage, and distribution stage are put together into one group and the waste treatment stage is assumed to be the step of filling in all things, the comparison of the two methods is not complete. With the roughness in mind, the process analysis using the $CO_2$ emission ratio gives:

"Production Stage": about 5.16% "Using Stage": about 94.78% "Waste Treatment Stage": about 0.06%

In contrast, the method of the present invention gives:

Total of three stages, "Material Acquisition Stage"+"Production Stage"+"Distribution Stage": 9.2%

"Using Stage": 89.9%

Total of two stages, "Waste Treatment Stage"+"Recycling": 1.0%

From these figures, it is found that the method of the present invention produces the same effect as that of the process analysis.

Since the full-scale LCA analysis by the process analysis requires enormous time and labor, the method of the present invention is in no way inferior to the full-scale LCA analysis, proving that it enables an easy assessment of environmental loads.

TABLE 1

Comparison of Process Analysis with Method of Present Invention for Refrigerators ($CO_2$ Emission Ratio)

| Life Stage | Process Analysis | Method of Invention |
|---|---|---|
| Material Acquisition Stage | 5.16% | 7.7% |
| Production Stage | | 0.7% |
| Distribution Stage | | 0.8% |
| Using stage | 94.78% | 89.9% |
| Waste Treatinent Stage | 0.06% | 3.2% |
| Recycling Stage | −2.2% | |
| Remarks | Waste treatment is done by filling in all things. Load reduction by recycling is not considered. | On the basis of statistical materials on disposal of electric appliances. |

SECOND EMBODIMENT

A second embodiment of an environmental load assessment apparatus of the present invention will be explained. The basic operation and principle are the same as those in the first embodiment, so a detailed explanation of the same terms will not be given.

Figure 15:
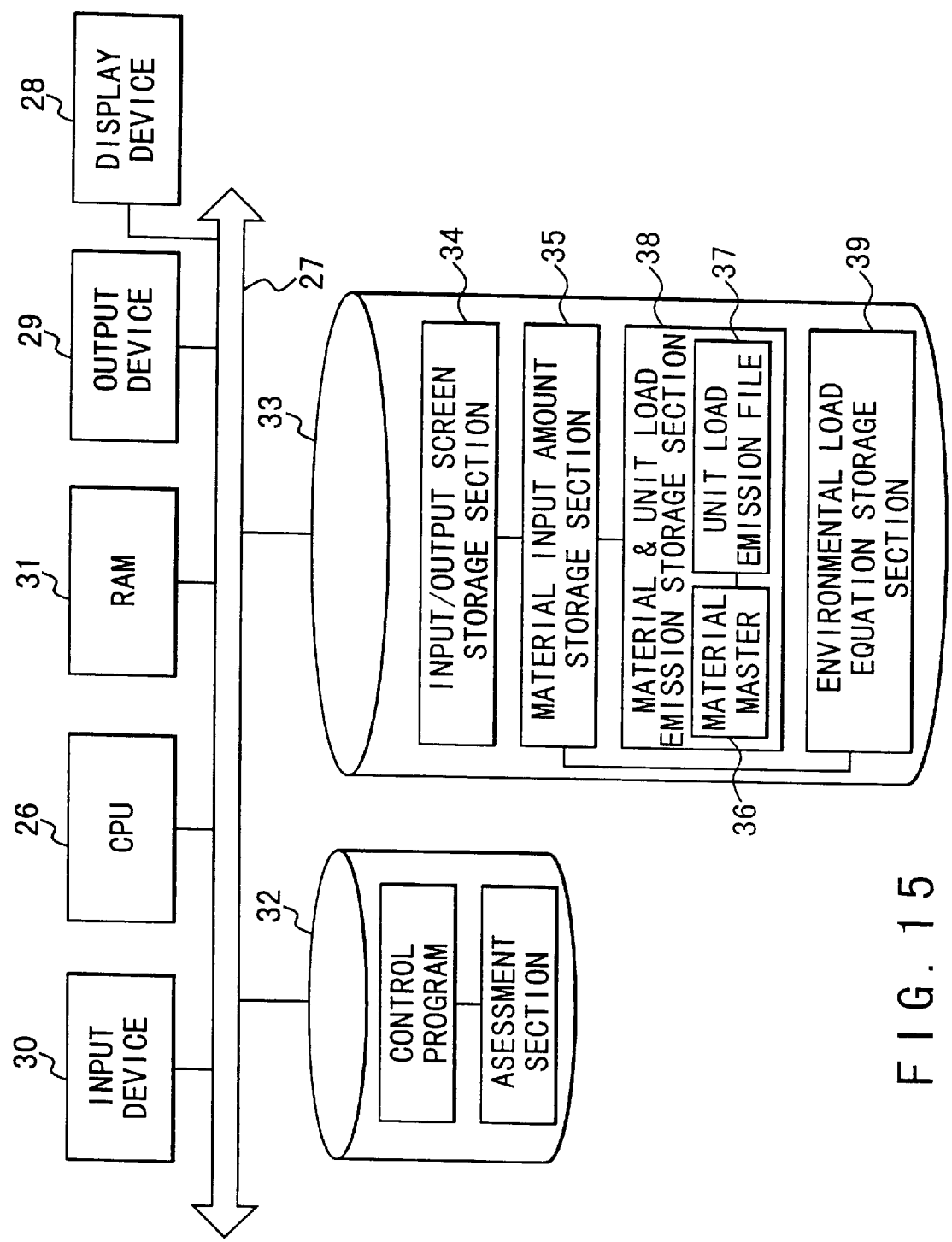
FIG. 15 is a schematic block diagram of a second embodiment of the present invention.

FIG. 15 shows an example of the hardware configuration of an environmental load assessment apparatus according to the second embodiment.

In FIG. 15, numeral 26 indicates a CPU. The CPU 26 is connected to a bus line 27. Connected to the bus line 27 are a display device 28, such as a monitor, an output device 29, such as a printer, an input device 30, such as a keyboard or a mouse, a RAM 31, a main memory 32 that stores control programs, and a file storage memory 33.

The file storage memory 33 includes an input/output screen storage section 34 that stores input/output screen forms, a material input amount storage section 35 that stores the amount of material input for each of stage S1 to stage S6, a unit load emission storage section 38 that stores a material master and a unit load emission file 37 related to the material master, and an equation storage section 39 that stores the environmental load equations. The RAM 31 is used to temporarily store not only the control programs read from the memories 32, 33 but also the display image data and the processing numerical data.

Figure 16:
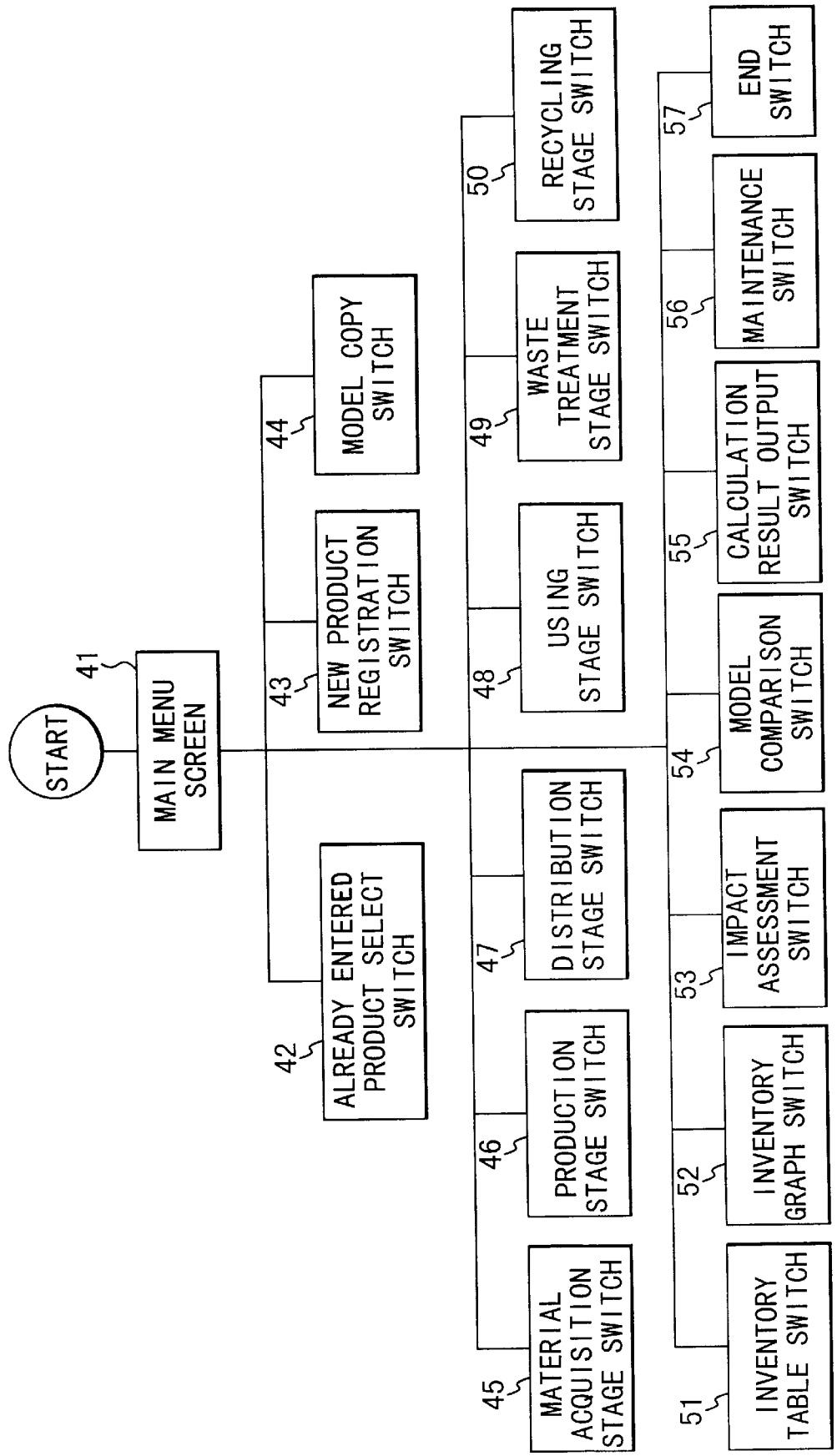
FIG. 16 is a block diagram to help explain the structure of the overview menu screen and its processes.

As shown in FIG. 16, the input/output screen storage section 34 has an overview menu screen 41 (see FIG. 17), which appears as an initial screen at the time of starting a program. The overview menu screen 41 has various switches indicated by reference numerals 42 to 57 in FIG. 16. These switches 42 to 57 are arranged in such a manner that the operator recognizes them readily.

Of the switches 42 to 57, the material acquisition stage switch 45, production stage switch 46, distribution stage switch 47, using stage switch 48, waste treatment stage switch 49, and recycling stage switch 50 correspond to the six life stages S1 to S6 into which the product life cycle is divided. Pressing one of the switches causes the material input screen (FIGS. 18, 21, 24, 27, or 32) at the corresponding stage to be read and appear on the display device 28.

The material input amount storage section 35 stores the material input amount entered from the overview menu screen 41 or one of the input screens (FIGS. 18, 21, 24, 27, and 32) corresponding to the stages S1 to S6 in such a manner that the material input amount corresponds to the corresponding environmental load equation stored in the environmental load equation section 39. Specifically, it is stored in a similar form to the calculation forms shown in FIGS. 4 to 9 in the first embodiment. The term "material" here means not only raw materials, such as iron and aluminium, used for a product but also the amount of energy, such as electric power, needed to produce and transport the product.

The material master 36 in the unit load emission storage section 35 stores the names of materials whose unit load emissions have been determined beforehand. The material master 35 has a hierarchic structure, including general classification, middle classification, and material name, which helps narrow down materials to a specific one. The unit load emission file 37 stores the unit load emission, that is, the amount of emission of an environmental load factor per unit material, in such a manner that the amount of emission corresponds to the material name.

Differently from the first embodiment, the unit load emissions used include not only unit $CO_2$ emission, unit $SO_x$ emission, and unit $NO_x$ emission obtained by estimating the input amounts of six types of fossil fuel from the nation's input-output tables (in this case, integrated 407 categories), but also BOD (biochemical oxygen demand) and COD (chemical oxygen demand) obtained from the input-output tables using Japan's industry research statistics and the Environment Agency's water examination statistics by industry. While in the second embodiment, what have been obtained from Japan's statistical materials are used as unit load emissions, what have been obtained from statistical materials of the same type according to the nation for which an analysis is made may be used. They may be stored in the form of a database by nation.

The environmental load equation storage section 39 stores the environmental load equations modeled to determine the amount of emission of environmental loads at each of the stages S1 to S6. The environmental load equations are used to calculate the amount of emission of an environmental load from the input about of each material and the unit load emission corresponding to the material stored in the input material storage section 35. The environmental load equations are modeled on the life stages S1 to S6.

Hereinafter, a concrete explanation will be given, using a washing machine as a product to be analyzed.

First, when the operator enters a program start instruction from the input device, for example, the CPU 26 starts the control program and causes the overview menu screen on the display device shown in FIG. 21.

With the overview menu screen, the product name is first entered. In the case of an already registered model, it can be chosen from a pull-down menu by the already entered product select switch 42. When a product is registered, the new product registration switch 43 is pressed and then data on the product is entered. In the second embodiment, the product name "Washing Machine" and its model name "AW-1234" are entered.

Next, data is entered by pressing one of the switches corresponding to stage S1 to stage S6 of the product's life cycle, that is, by pressing one of the material acquisition stage switch 45, production stage switch 46, distribution stage switch 47, using stage switch 48, waste treatment stage switch 49, and recycling stage switch 40.

Hereinafter, Stage S1 to stage S6 will be described in order.

Figure 20:
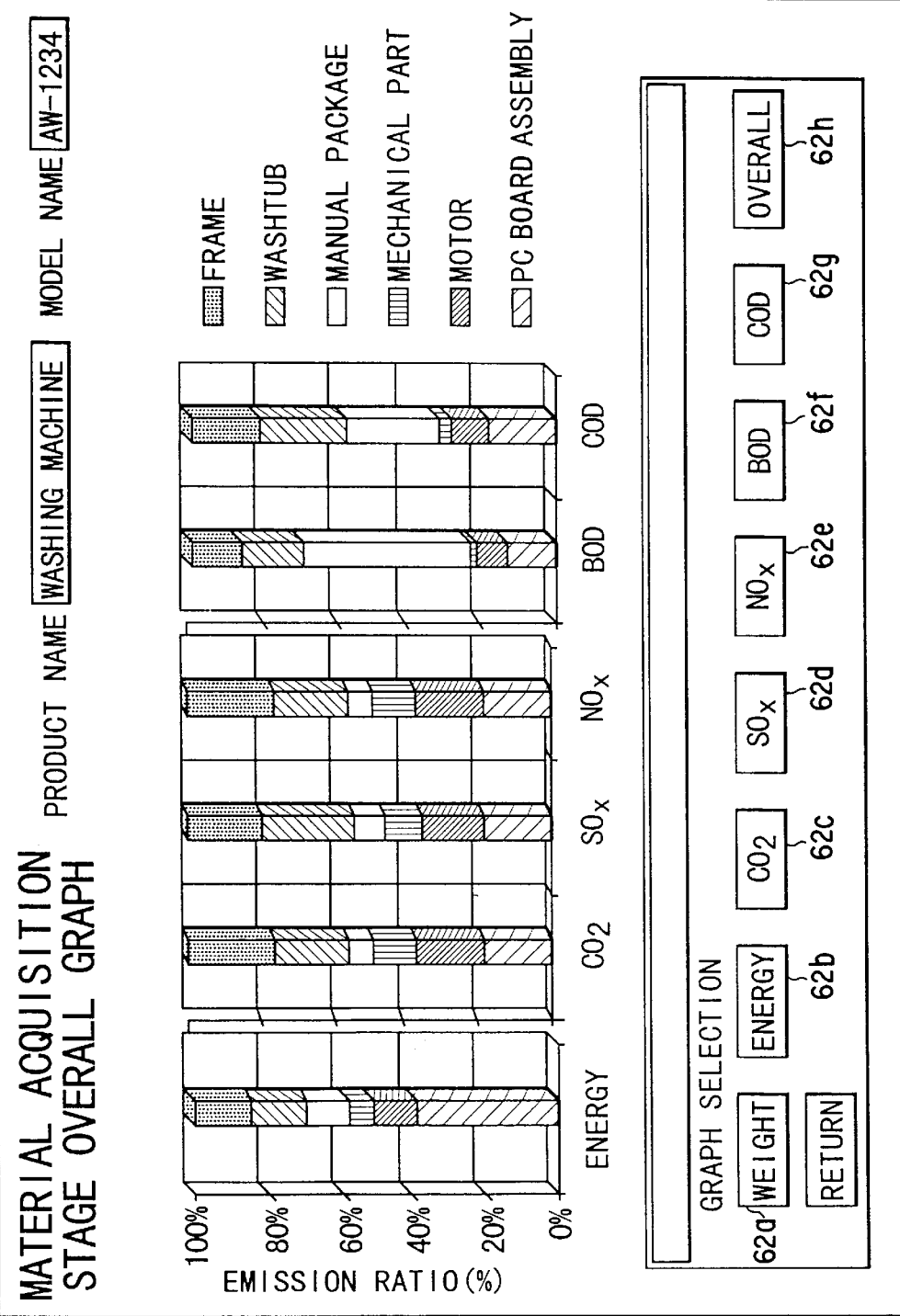
FIG. 20 illustrates an example of the output screen at the material acquisition stage in the second embodiment.

[1] Material Acquisition Stage S1 (FIGS. 18 to 20)

First, with the overview menu screen 41, pressing the material acquisition stage switch 45 causes the part input screen 50 of FIG. 19 to appear. On the part input screen 59, the part names, material names, the usage of component materials used for one washing machine to be analyzed are entered in the text boxes of the display screen 59.

The method of inputting part names has a hierarchic structure of three layers, including unit name, subunit name, and part name, which enables classification according to the assembly structure of the product. The method is further designed to display the results by unit according to the calculation of the amount of emission of environmental load factors explained later.

The material names are selected and decided on the basis of the material master 36. Specifically, the material classification has a hierarchic structure, including general classification, middle classification, and material name, to facilitate selection according to the material master, which helps narrow down materials to a specific one.

For instance, the washtub of a washing machine is entered, the unit name "Washtub", the subunit name "Spin-Drier Tub Assembly", and the part name "Spin-Drier Tub" are given. The material name is narrowed down in this order: the large classification "Resin", the middle classification "Thermoplastic Resin" and the material name "Polypropylene." To decide the material name, the material name decision switch 60 is pressed. A unit of the amount (usage) is used according to the material classification: for example, 3,300 g is entered.

The entered specifications are automatically added in the form of one record in the raw material input table indicated by reference numeral 61 in FIG. 18. The raw material input table 61 is stored in the material input storage section 35.

After the specifications have entered for all of the component parts of one washing machine, the table switch 61 appearing on the screen 59 of FIG. 19 is pressed. This makes the CPU 26 start the following calculations.

First, the unit load emission for each material is read from the unit load emission file 37 related to the material master 36. Then, the input amount for each material and the corresponding unit load emission are substituted into the corresponding environmental load equation read from the environmental load equation storage section 39. Then, the amount of emission of environmental loads for each material is calculated. In the second embodiment, too, the same calculations are done as explained in FIG. 4 in the first embodiment. The calculations are repeated as many times as there are input materials. Finally, the amount of emission of environmental loads for each material is added up. As indicated by reference symbols 61a to 61f in FIG. 18, the total amount of emission of each environmental load at the material acquisition stage is outputted.

In the second embodiment, as described earlier, six types of inventory, including energy, the amount of $CO_2$ emission, the amount of $SO_x$ emission, the amount of $NO_x$ emission, the amount of BOD emission, and the amount of COD emission, are calculated as environmental loads. Then, pressing the graph switch 62 on the input screen 59 of FIG. 19 causes an overall display graph of FIG. 20 to appear. On the graph, the ratio (%) of the amount of each part is shown by environmental load. The output screen is provided with the sub-switches 62a to 62h. Pressing the sub-switches causes a detailed graph (not shown) for each environmental load factor to appear.

Figure 23:
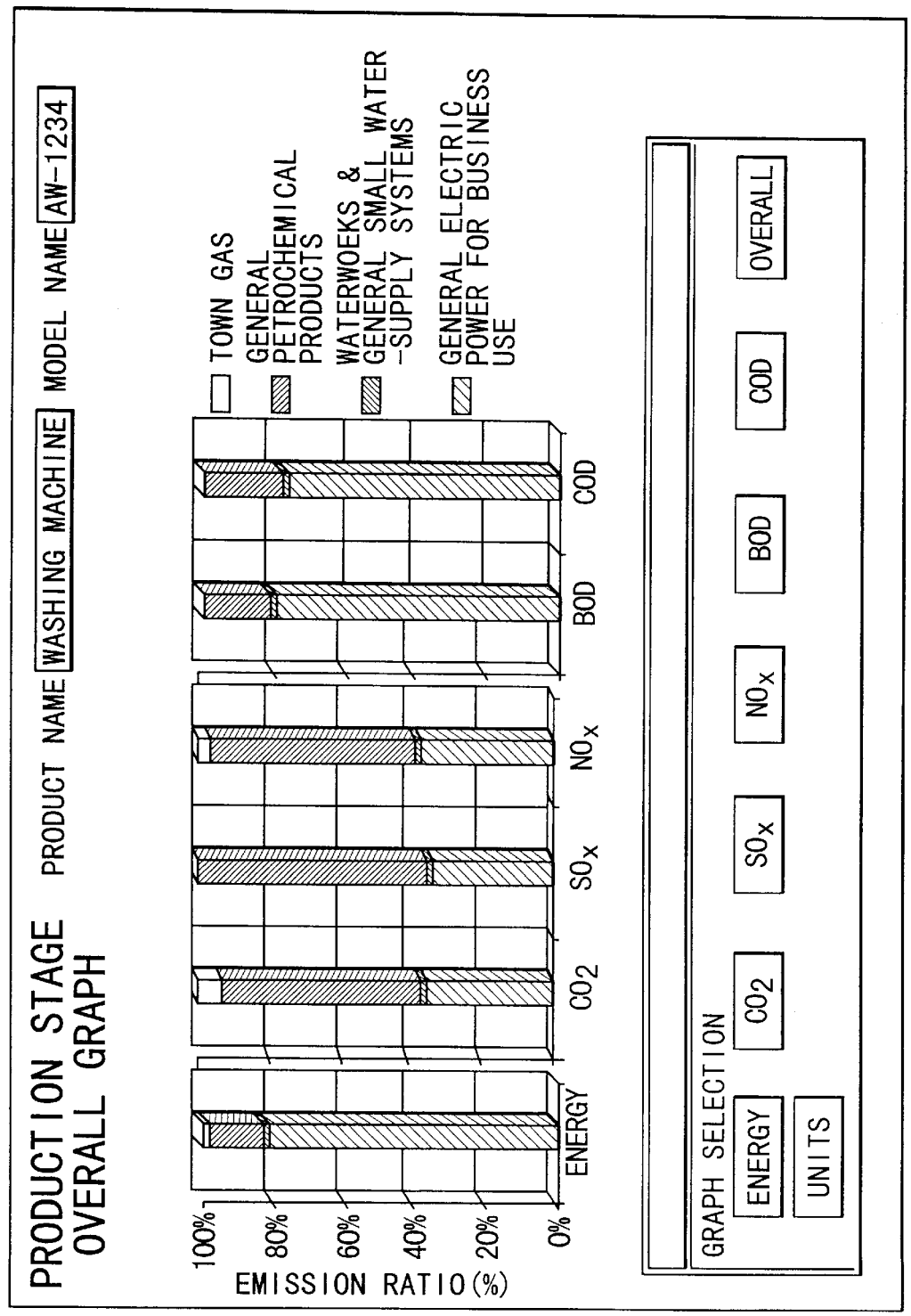
FIG. 23 illustrates an example of the output screen at the production stage in the second embodiment.

[2] Production Stage S2 (FIGS. 21 to 23)

Figure 17:
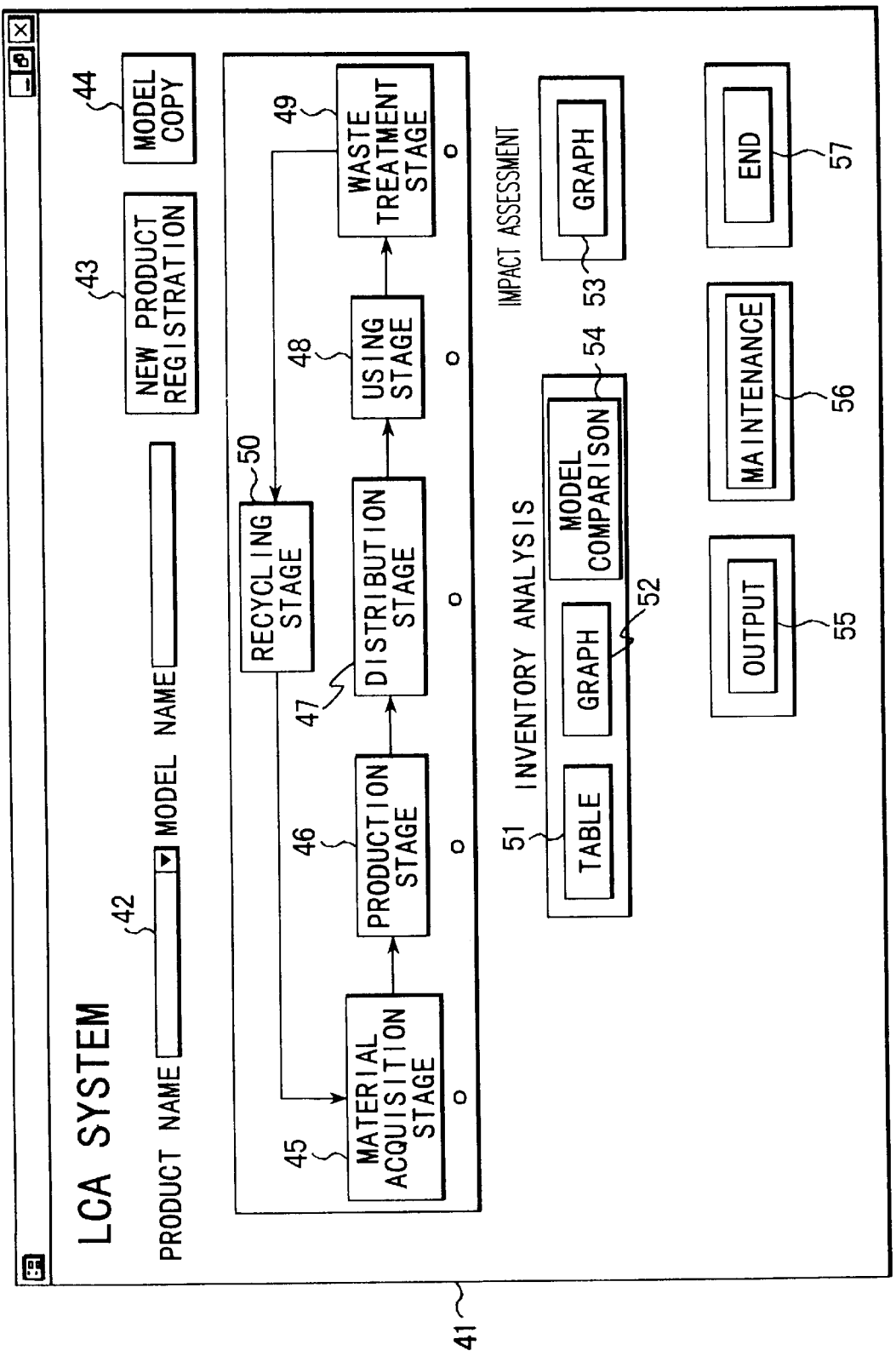
FIG. 17 shows an example of the overview menu screen in the second embodiment.

First, with the overview menu screen 41 shown in FIGS. 16 and 17, pressing the production stage switch 46 causes the input screen 63 of FIG. 22 to be read from the input/output screen storage section 34 and appear.

With the input screen 63, the types of energy, including electric power, water, gas, and petrochemical products, fed at the production stage, and such secondary materials as cleaning agents and carrying boxes are entered. These are also stored in the material master 36 in a classified state beforehand.

The unit load emission corresponding to each is stored in the unit load emission file 37 in such a manner that it is associated with the material master 36. The amount of energy entered from the input screen 63 is the amount per product. The quotient of the total amount of each type of energy in a factory divided by the ratio of the shipment price of one product to be analyzed to the total sum of shipment is used as the amount of energy entered.

Next, the input energy, such as electric power, fed to produce one washing machine is entered by selecting the material name and the amount as in the material acquisition stage. The results are recorded in the production stage input table 64 as shown in FIG. 21. The input table 64 is stored in the material input storage section 35. In this way, the data is inputted for all types of energy and all the secondary materials.

Then, pressing the table switch 65 causes the amount of emission of each environmental load to be calculated using the equation by reference to the material master 36 and unit load emission file 37. Then, pressing the graph switch 66 causes a graph to appear with the emission ratio (%) of the individual inventories at the production stage (FIG. 23).

Figure 26:
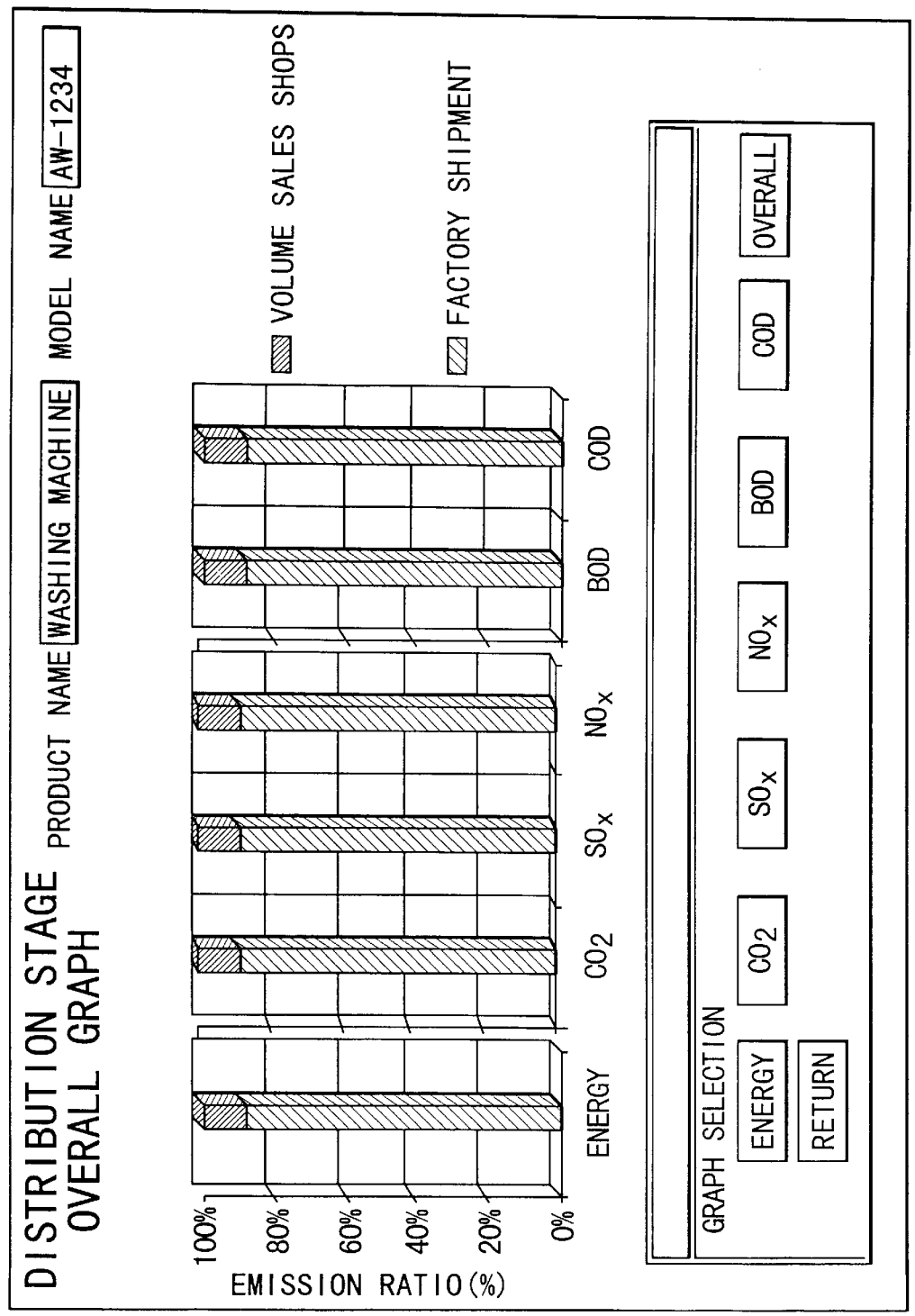
FIG. 26 illustrates an example of the output screen at the distribution stage in the second embodiment.
Figure 30:
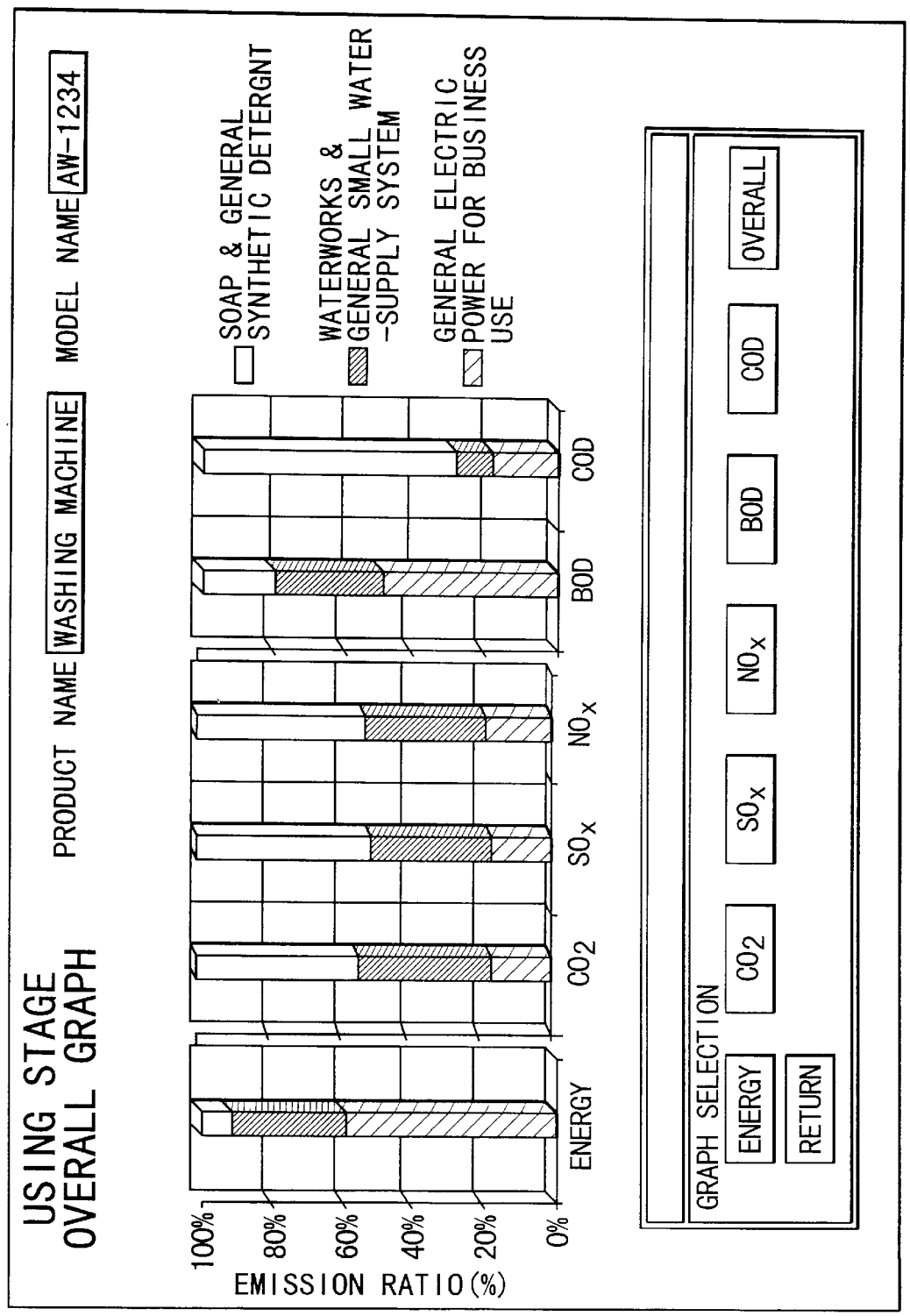
FIG. 30 illustrates an example of the output screen at the using stage in the second embodiment.

[3] Distribution Stage (FIGS. 24 to 26)

First, with the overview menu screen 41 shown in FIGS. 16 and 17, pressing distribution stage switch 47 causes the transport means input screen 68 to appear as shown in FIG. 25.

At the distribution stage, only the fuel consumption of transport trucks is considered. First, the type of truck and the type of fuel are entered. From the type of truck and the type of fuel and from the material master listing the mileage obtained from statistical materials, the fuel consumption is calculated.

With the input screen 68, the number of products loaded per truck is determined from the package capacity of one product. That is, with the screen 68, the loading capacity is found by entering the dimensions of the load-carrying platform of the truck. From the loading capacity, the number of products loaded is calculated.

These conditions are stored in the material input table 69 of FIG. 24 as in the preceding stage.

Then, as shown in FIG. 25, with the input screen 68, pressing the table switch 71 causes the amount of emission of each environmental load to be calculated, referring to the material master 36 and unit load emission file 37, as in the preceding stage. Then, pressing the graph switch 72 causes a graph of FIG. 26 to appear with the emission ratio (%) of the individual inventories at the distribution stage.

[4] Using Stage S4 (FIGS. 27 to 30)

With the overview menu screen 41 shown in FIGS. 16 and 17, pressing the using stage switch 48 causes the using pattern design screen 74 to appear as shown in FIGS. 27 and 28. The design screen 74 is used to enter using patterns. On this screen, the operator enters using conditions, including using patterns and pattern classification. The using conditions include corporate use, private use, time use, and number-of-times use.

Then, pressing the input switch 75 provided on the design screen 74 causes the using conditions input screen 76 of FIG. 29 to appear. On this screen, the usage per product and frequency of use regarding the materials and energy, including electric power, water, and paper, fed at the using stage of the product, and the average service life of the product are entered. These using conditions are recorded in the using stage input table 77 of FIG. 27. The table is stored in the material input amount storage section 35. Then, with the using condition input screen 76, pressing the table switch 78 causes the total usage (the number of times of use) of the product to be calculated as indicated by reference numeral 79 in FIG. 27. Referring to the material master 36 and unit load emission file 37, the amount of emission of each environmental load at the using stage is calculated. Then, pressing the graph switch 40 causes a graph of FIG. 30 to appear with the emission ratio (%) of the individual inventories at the distribution stage as in the material acquisition stage.

[5] [6] Waste Treatment and Recycling stages S5 and S6 (FIGS. 31 to 36)

Figure 31:
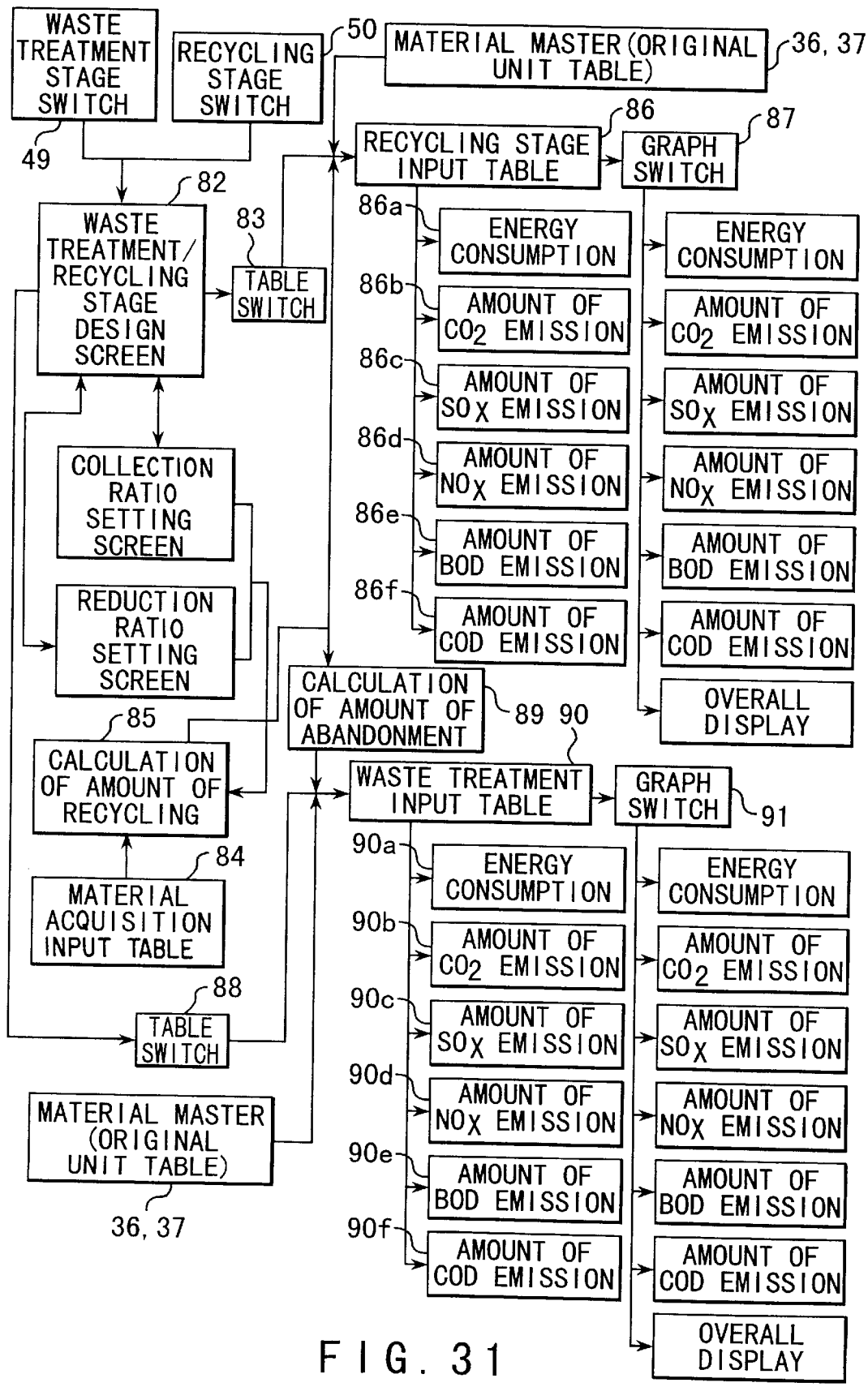
FIG. 31 is a block diagram to help explain the processing in the waste treatment/recycling stages in the second embodiment.
Figure 32:
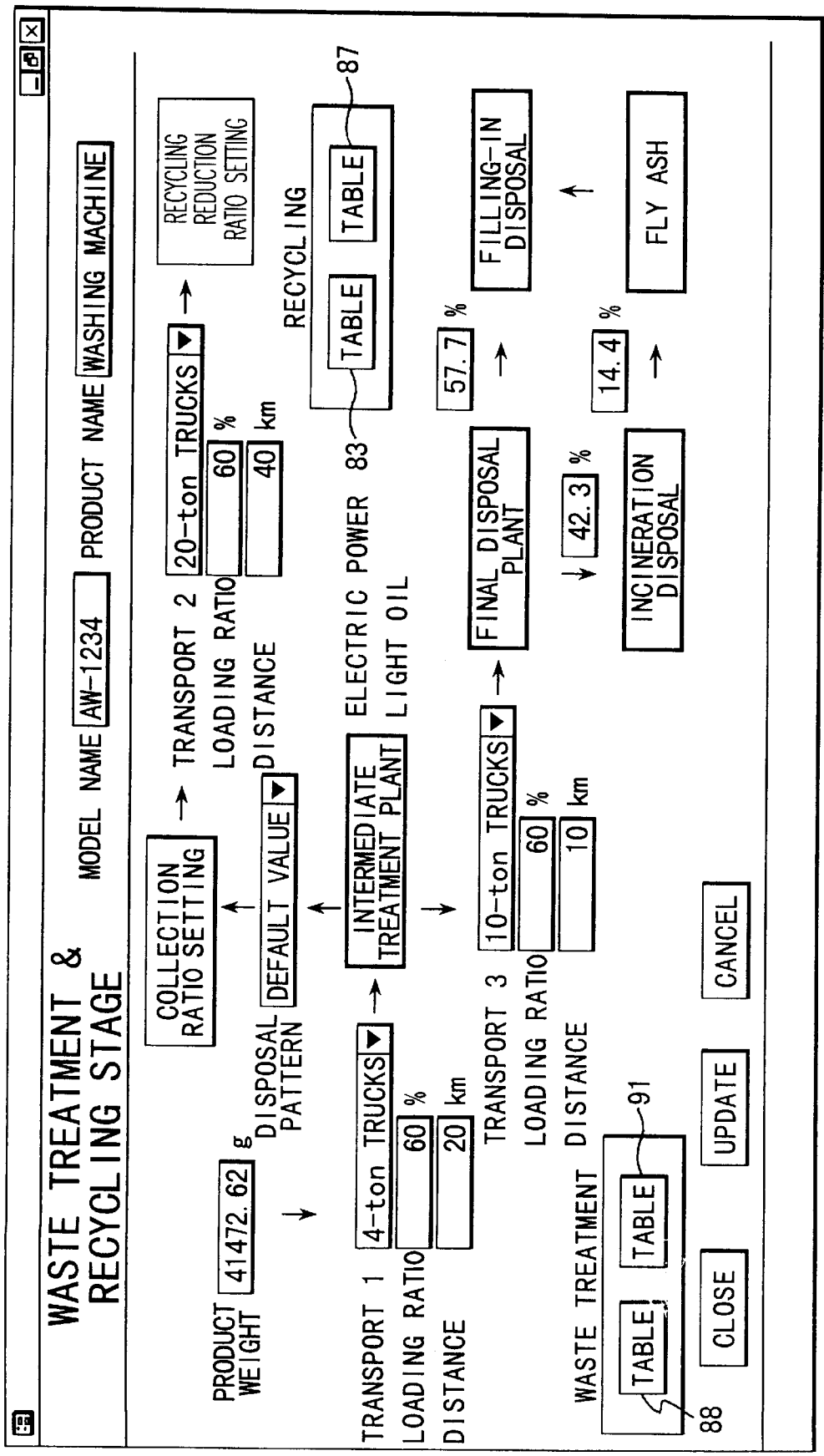
FIG. 32 illustrates an example of the input screen in the waste treatment/recycling stages in the second embodiment.
Figure 35:
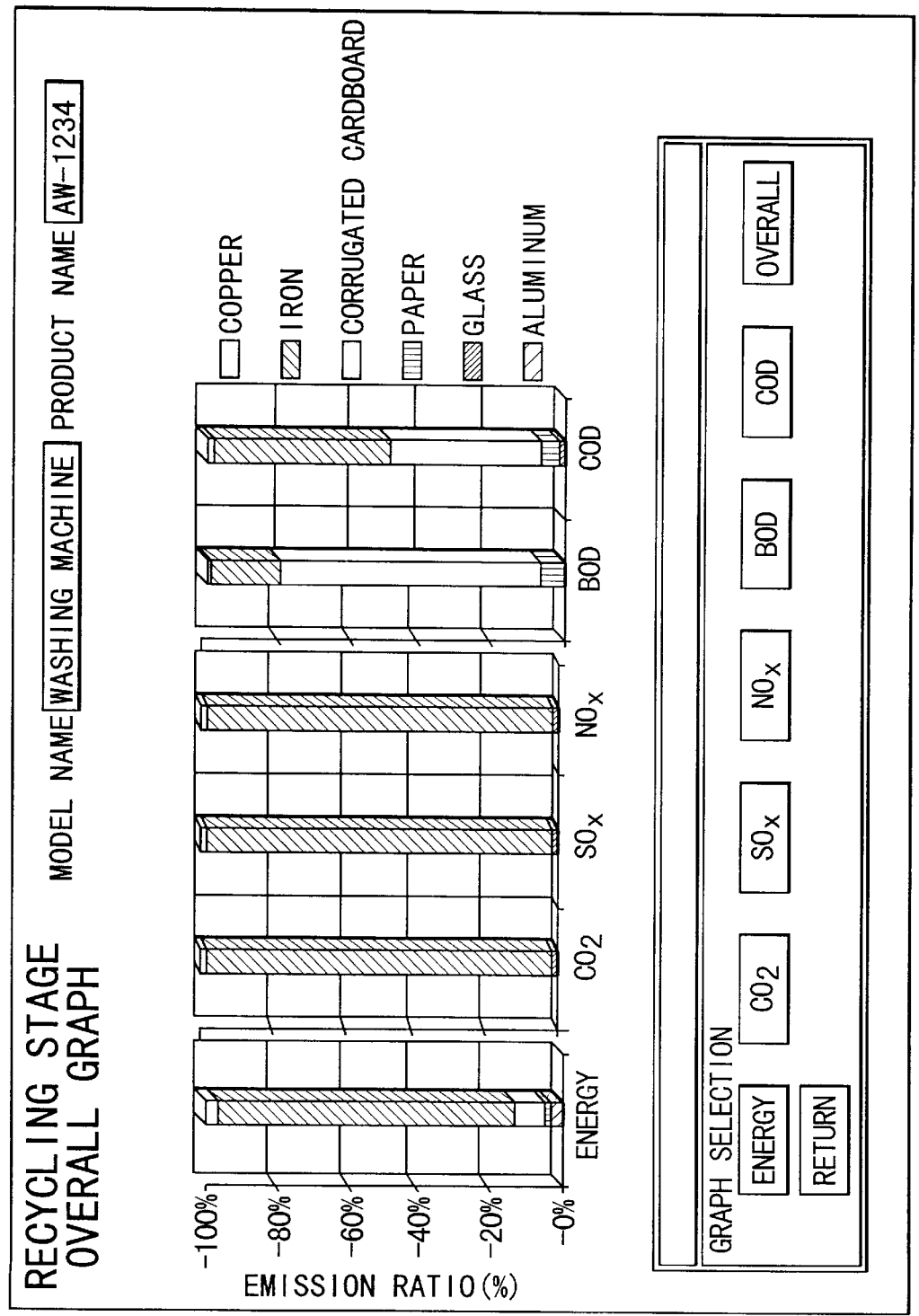
FIG. 35 illustrates an example of the output screen in the waste treatment/recycling stages in the second embodiment.
Figure 36:
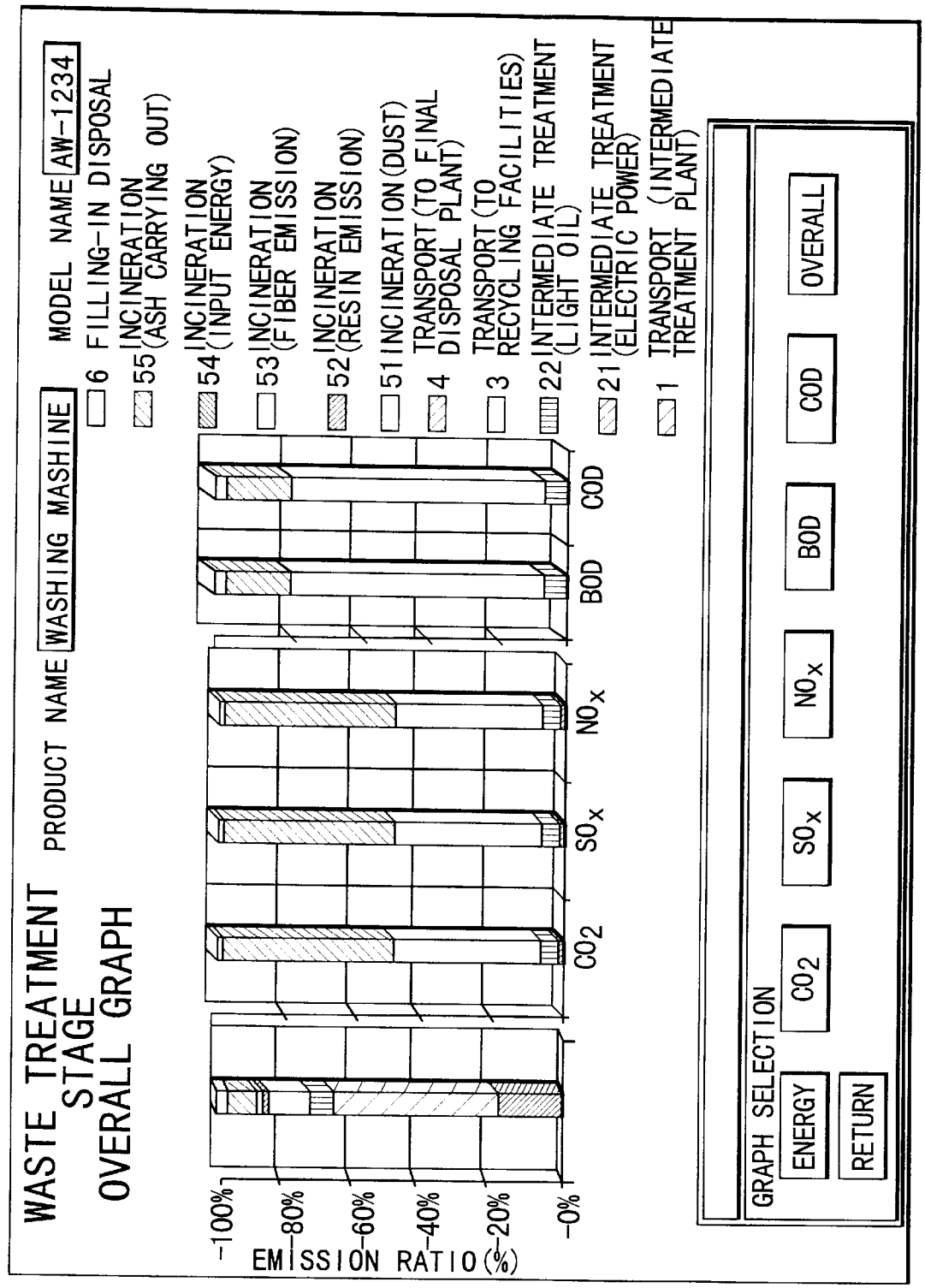
FIG. 36 illustrates an example of the output screen in the waste treatment/recycling stages in the second embodiment.

With the overview menu screen 41 shown in FIGS. 16 and 17, pressing the waste treatment stage switch 49 or recycling stage switch 50 causes the screen to change to the common waste treatment and recycling stage design screen 82 as shown in FIGS. 31 and 32.

The screen 82 is designed as shown in FIG. 32. As shown on the display screen 82, the step model in the waste treatment and recycling stages is almost the same as that in the first embodiment.

While on the input screen 82, the values based on electric appliance disposal statistics are set as the default values, the processing form or recycling situation can be changed according to the product. Specifically, the screen 82 is designed to cause the recovery rate setting pop-up screen of FIG. 33 or the restoration rate setting pop-up screen to appear on the screen 82, enabling the change of these rates.

Then, with the design screen 82 of FIG. 32, pressing the table switch 83 causes the recycling amount to be calculated using the recovery rate and restoration rate set on the basis of the raw material input table 84 of FIG. 31. Then, the recycling state input table 86 is formed. On the basis of the table, the amount of emission of each environmental load is calculated (86a to 86f). Then, pressing the graph switch 87 causes a graph of FIG. 35 to appear with the emission ratio (%) of the individual inventories at the recycling stage.

Next, pressing the table switch 88 of FIG. 32 causes the amount of waste to be calculated for the remaining materials (unrecycling materials) in the calculation of the environment amount. Then, the waste treatment stage input table 90 is formed. Referring to the material masters 36, 37, the amount of emission of each of environmental loads 90a to 90F is calculated. Then, pressing the graph switch 91 causes a graph to appear with the emission ratio (%) of the individual inventories at the waste treatment stage.

Figure 37:
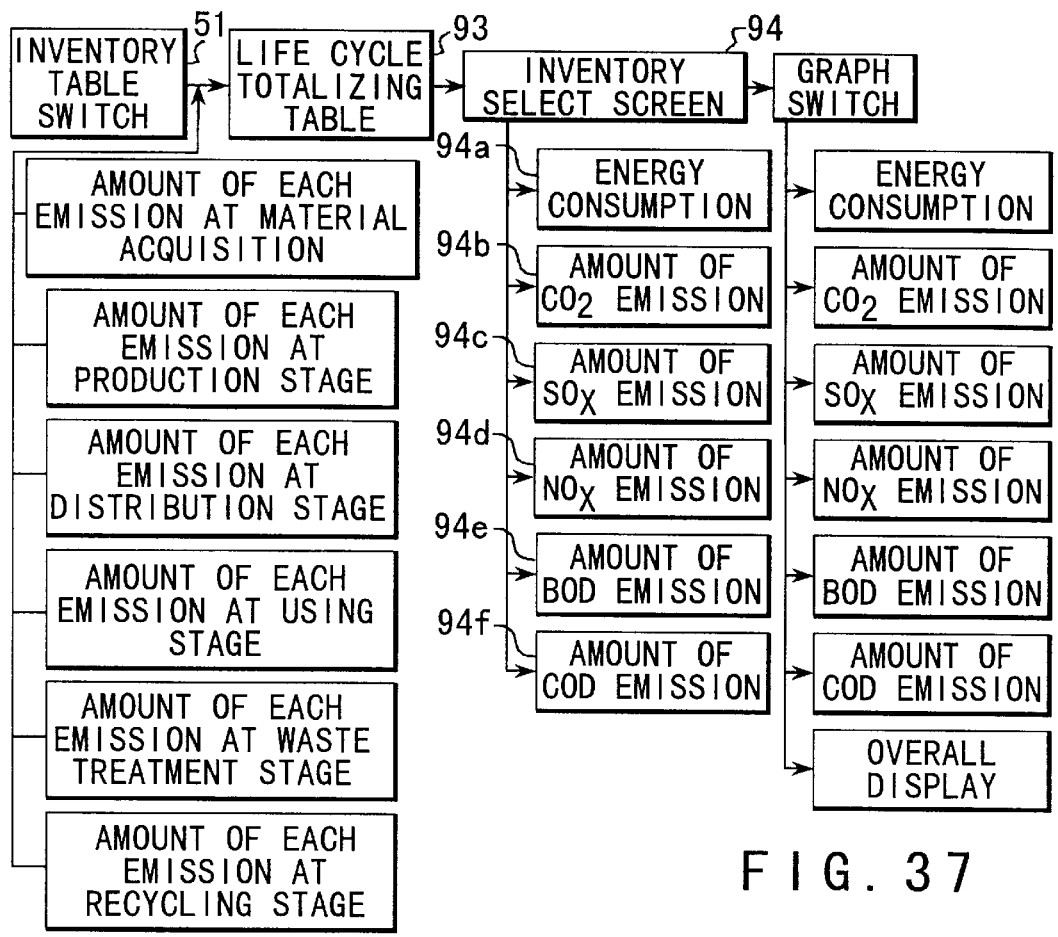
FIG. 37 is a block diagram to help explain the process of outputting the calculation results throughout the life cycle in the second embodiment.
Figure 38:
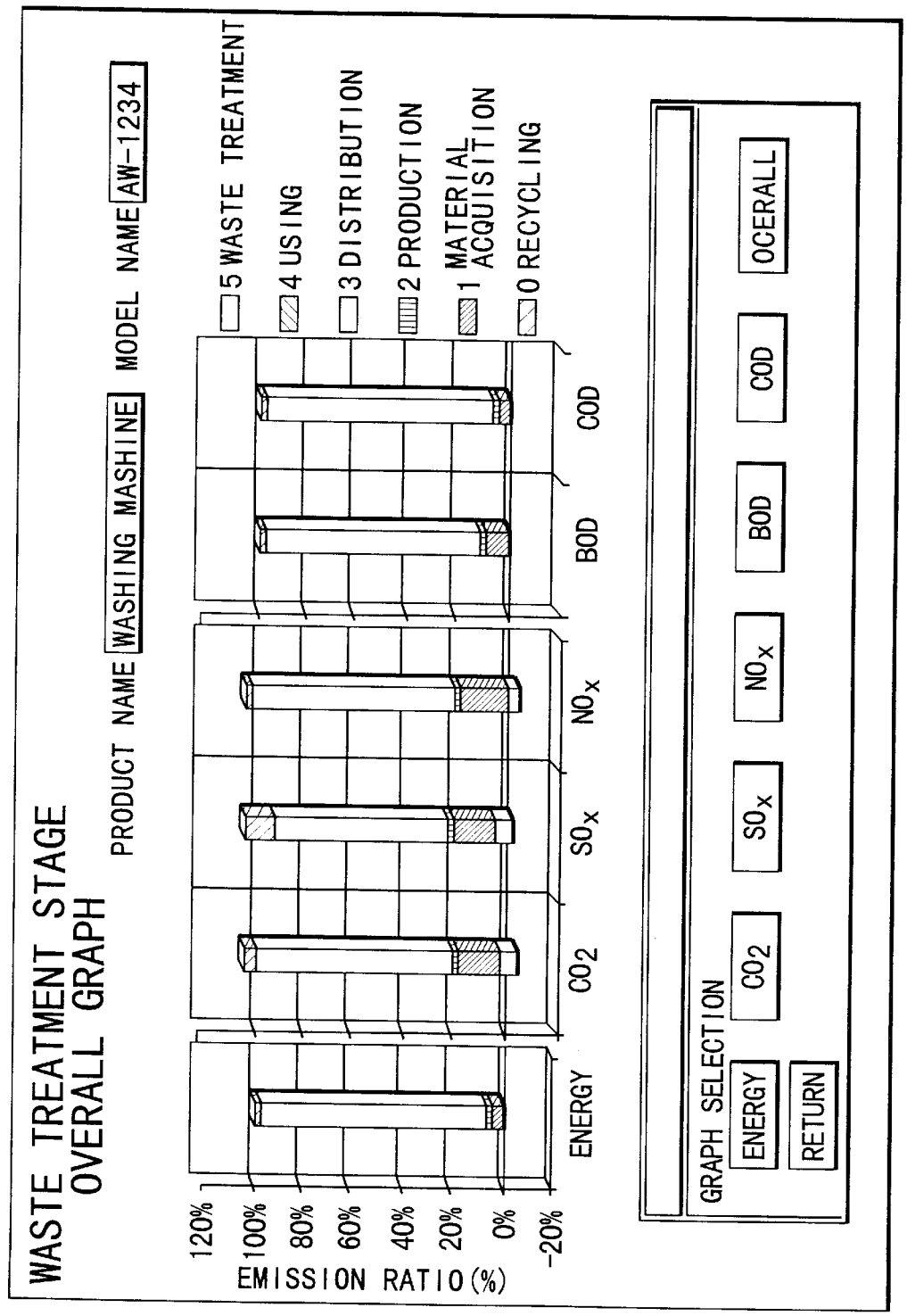
FIG. 38 illustrates an example of the output screen of the calculation results throughout the life cycle in the second embodiment.

Next, the totalizing of the inventories (life cycle inventories) in the entire life cycle will be described by reference to FIGS. 37 and 38.

After the input and calculations at each stage have been completed, when the operator returns to the overview menu screen shown in FIGS. 16 and 17 and presses the inventory table switch 51, the CPU 26 reads the output result of the amount of emission for each inventory at each stage obtained until now and forms a totalizing table 93 for the entire life cycle and calculates the amount of emission 94a to 94f for each of the inventories in the life cycle on the inventory select screen 94 (not shown). Then, pressing the inventory graph switch 95 causes a graph of FIG. 38 to appear with the emission ratio (%) of the individual inventories.

Figure 40:
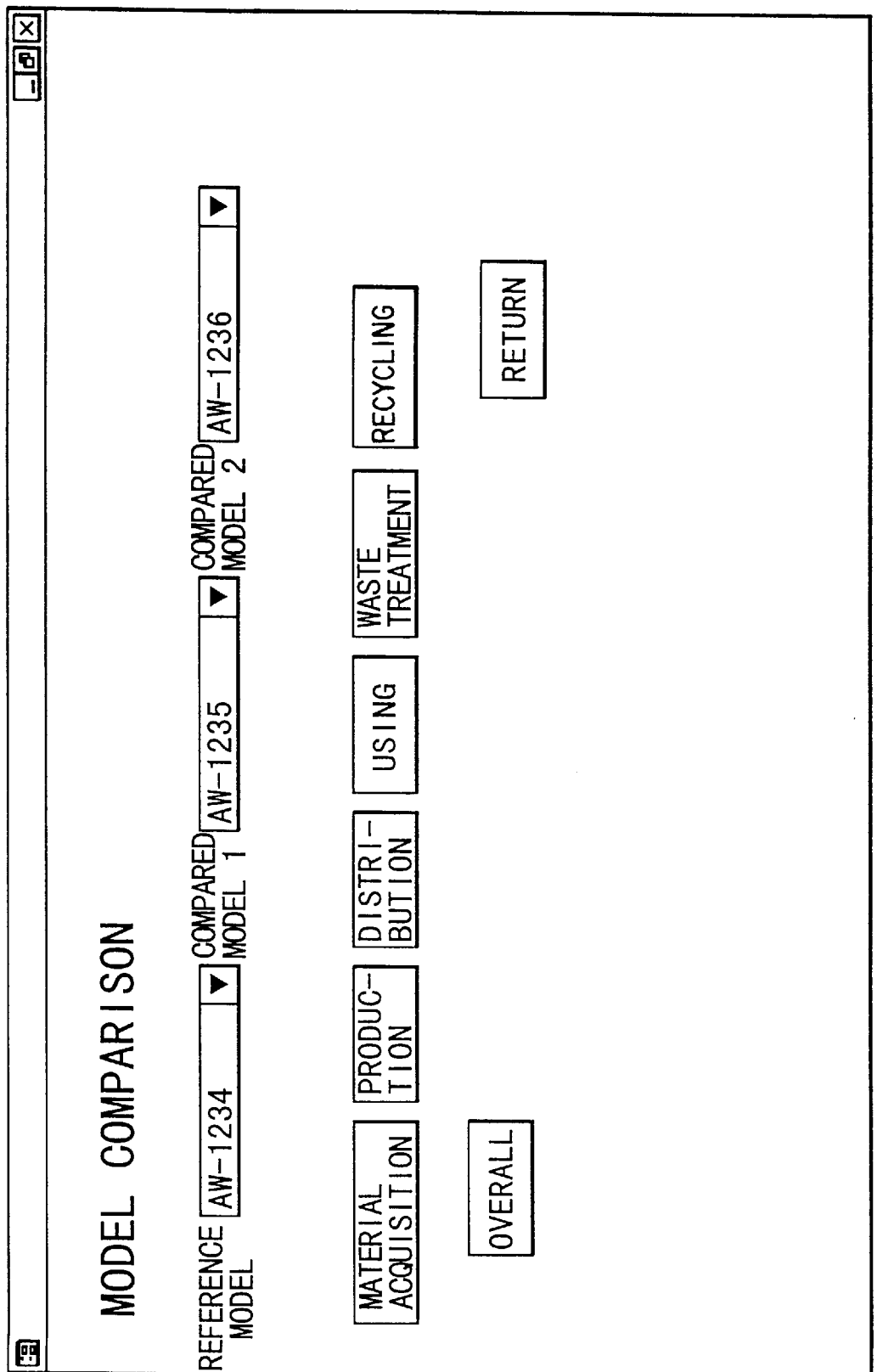
FIG. 40 illustrates an example of the input screen for comparison of models in the second embodiment.
Figure 41:
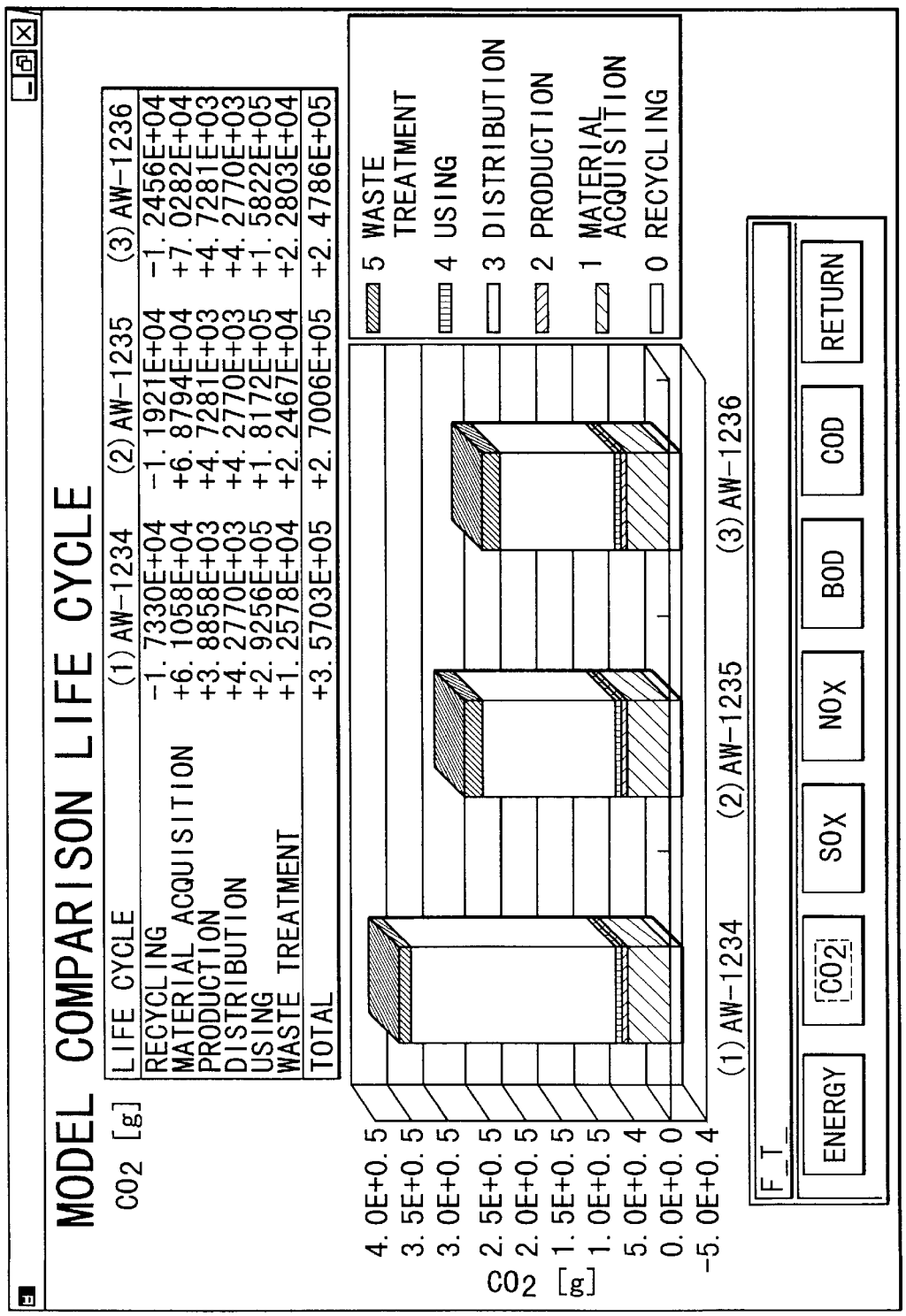
FIG. 41 illustrates an example of the output screen for comparison of models in the second embodiment.

Next, the function of comparing the models of products thus obtained will be described by reference to FIGS. 39 to 41.

Figure 39:
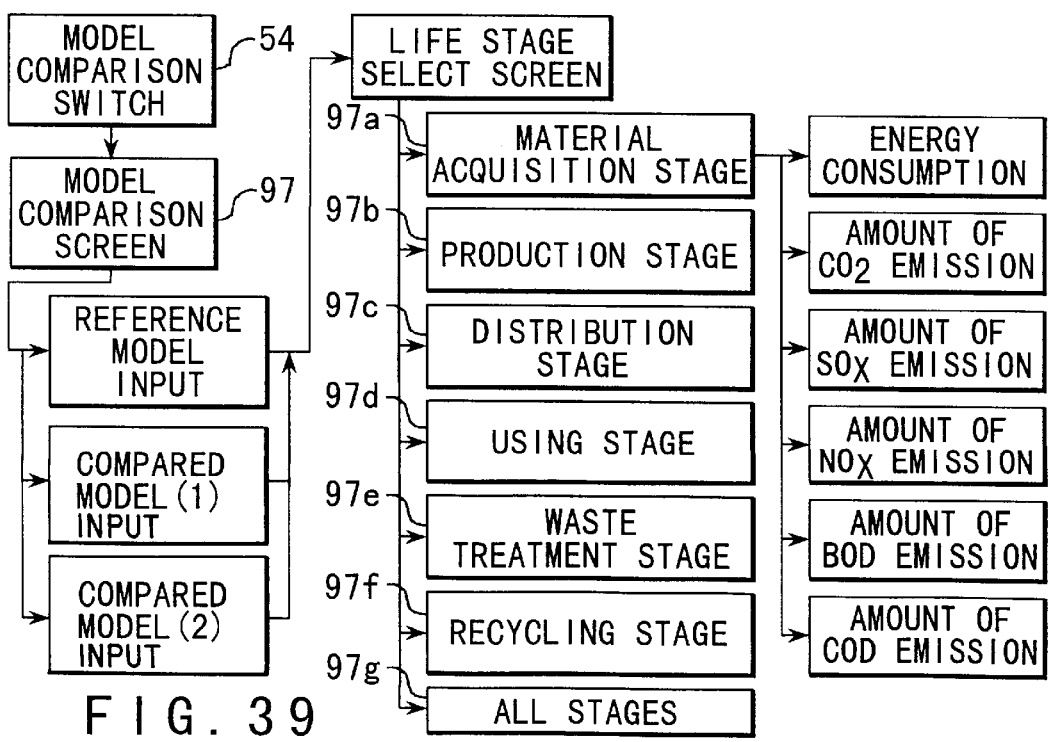
FIG. 39 is a block diagram to help explain the process of comparing models in the second embodiment.

First, with the overview menu screen 41 shown in FIGS. 16 and 17, pressing the model comparison switch 54 causes the screen to go to the model comparison setting screen 97 of FIG. 39. The model comparison setting screen 97 is designed as shown in FIG. 40. On this screen, a reference model, a model 1 to be compared, and a model 2 to be compared can be entered, the last two model being compared with the reference model. The model names may be chosen from the already entered model names. When with the screen 97, one of the switches 97a to 97f corresponding to each life stage (material acquisition to recycling stages) or the general switch 97g is pressed, the amount of emission for each of six inventories at that stage is calculated. Then, a table and a graph are outputted (FIG. 41 shows an example of the amount of $CO_2$ emission).

Finally, impact assessment that can be calculated from those inventories will be described by reference to FIGS. 42 to 46.

Impact assessment is a step following an inventory analysis in LCA (life cycle assessment) and stands for the assessment of an effect (impact) on the environment. This is done by calculating impact categories, including global warming, acid rain, and eutrophication of lakes and marshes, on the basis of each inventory obtained in the inventory analysis and finally making a comprehensive assessment weighting the categories.

Impact assessment techniques have been developed according to the situation of each country. They have not been standardized yet even among the LCA researchers.

The method in the present embodiment is constructed so as to make an assessment on the basis of three typical types of method: the Japan Ecolife Center-developed method 101, the Dutch eco-indicator method 102, and the Swiss eco-point method 103.

With the overview screen 41 shown in FIGS. 16 and 17, pressing the impact assessment switch 53 causes the screen to go to the assessment method select screen 100 as shown in FIG. 42. The screen 100 is designed as shown in FIG. 43. On the screen 100, the Japan Ecolife Center method 101, the eco-indicator method 102, or the eco-point method 103 can be selected.

The Ecolife Center method 101 is a method investigated and studied at the request of the Environmental Agency in 1993. The method is characterized by using the reciprocal of a regulation value as a reference. A warming index and acid rain index are expressed by $CO_2$ conversion and $SO_2$ conversion, respectively. Under present conditions, it is impossible to compare the sizes of categories.

The eco-indicator method 102, which provides a comprehensive index of environmental impact, has been proposed by the group lead by the Dutch ****** Leiden University Centre of Environmental Science. The method is a method of weighting the individual categories, considering a probability of one death per year per million people to be equivalent to a 5% ecosystem impairment, with a warming coefficient (GWP) or an acidification index (AP) as a reference, and making an assessment on the basis of the total sum of points.

The eco-point method (Switzerland) is a method of assessing environmental scarcity with the nation's policy target value as a reference. With the method, 19 items of load inventories are weighted to calculate eco-points (UBP).

Because the impact assessment methods have different indexes (categories) and the inventories to be determined amount to several hundred in number, only the indexes that can be calculated by the above three methods will be calculated from the six inventories obtained by the present simple assessment method.

Figure 44:
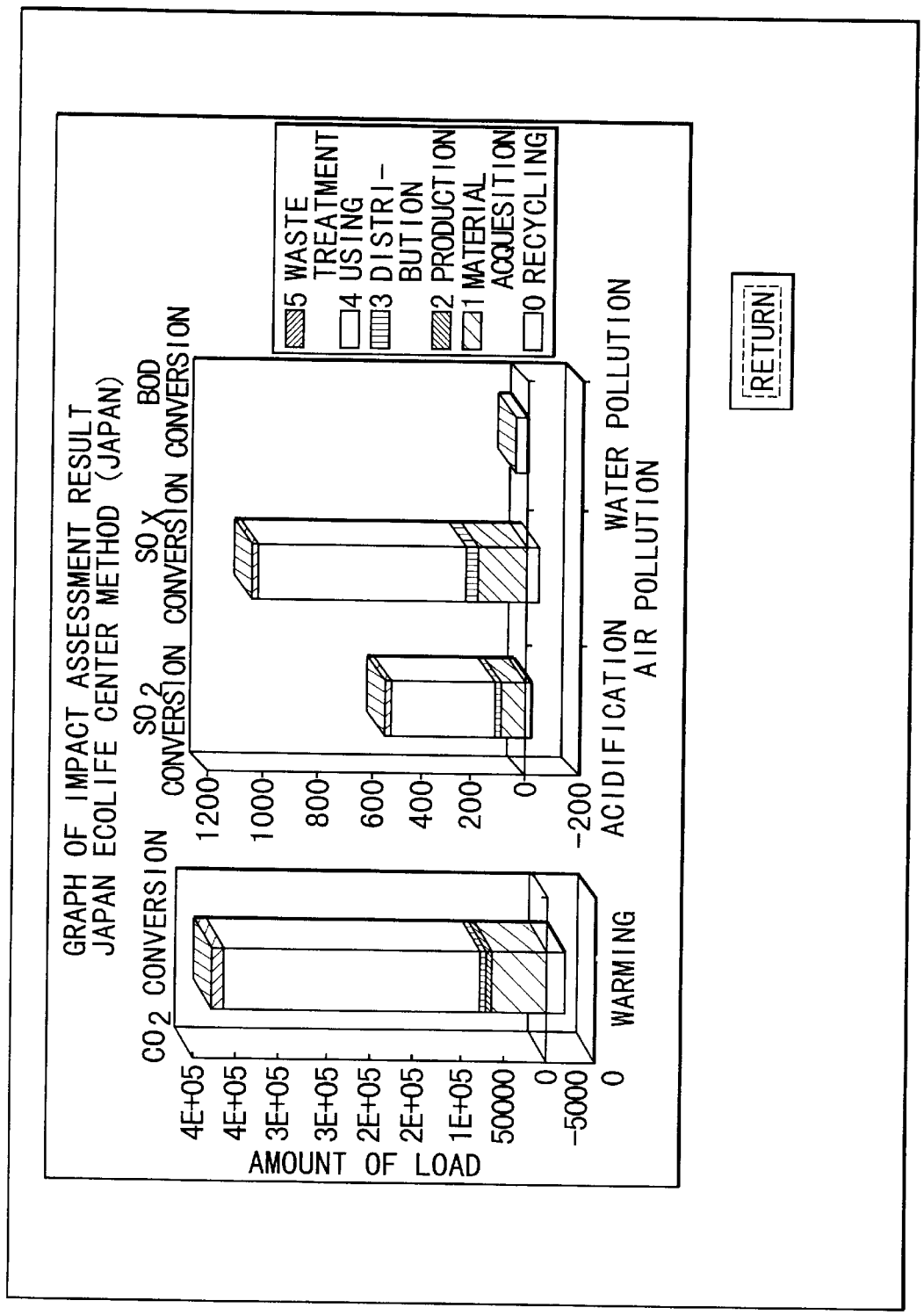
FIG. 44 illustrates an example of the output screen for impact assessment using the Japan Ecolife Center method in the second embodiment.

Specifically, pressing the Japan Ecolife Center method switch 101 causes the data table 108 of the model being edited to be read. Then, a warming index ($CO_2$ conversion) 104, an acid rain index ($SO_2$ conversion) 105, an air pollution index ($SO_x$ conversion) 106, and a water pollution index (BOD conversion) 107 are calculated for each life stage. The results are displayed in graph form (FIG. 44).

Figure 45:
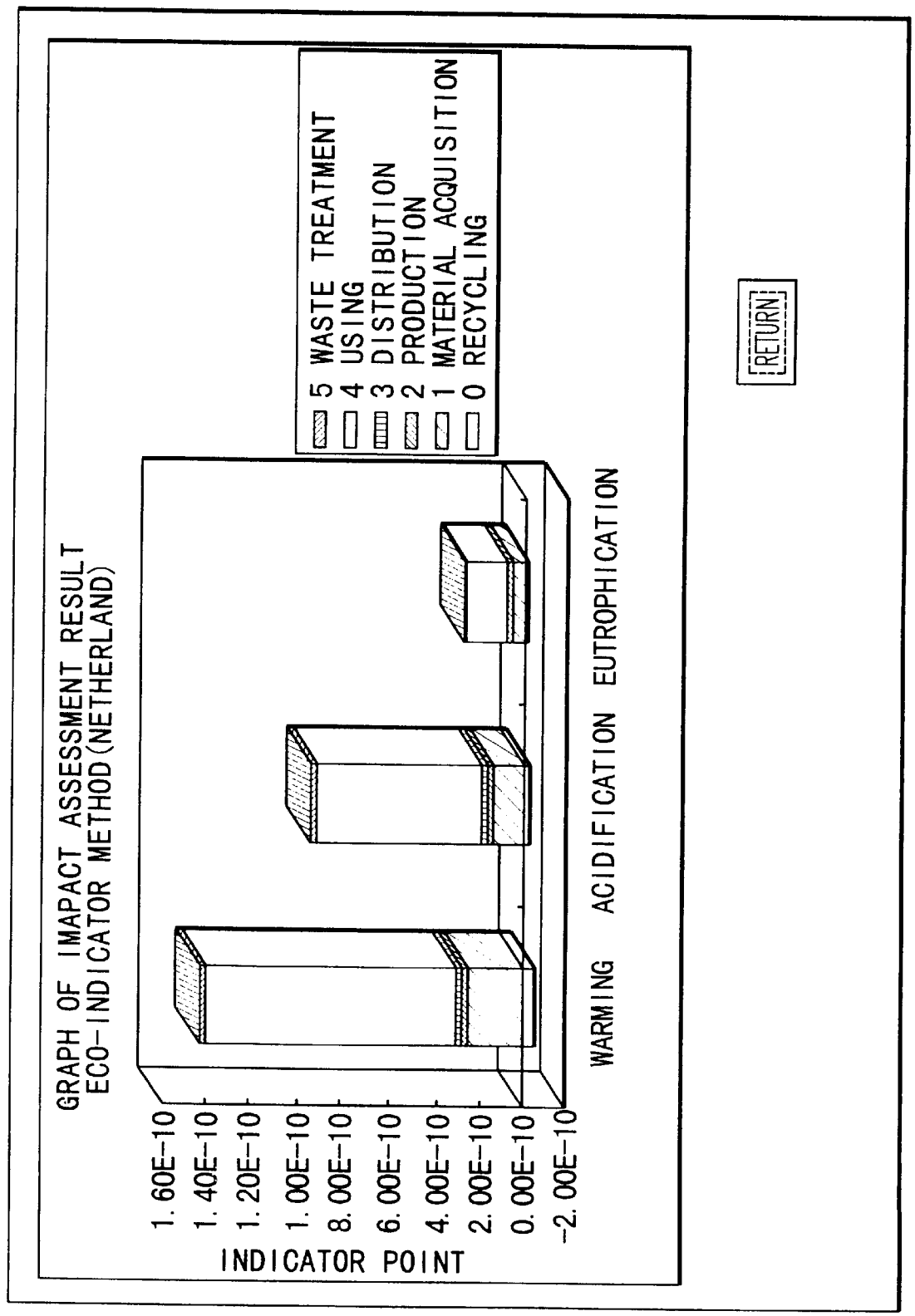
FIG. 45 illustrates an example of the output screen for impact assessment using the eco-indicator method in the second embodiment.

Pressing the eco-indicator method switch 102 causes the data table 108 of the model being edited to be read. Then, GWP ($CO_2$ conversion) and AP ($NO_x$ conversion) are calculated. Thereafter, referring to the indicator point conversion table 109, the warming index, acidification index, and eutrophication index are converted into indicator points (110 to 112) for each life stage. The results are displayed in graph form (FIG. 45).

Figure 46:
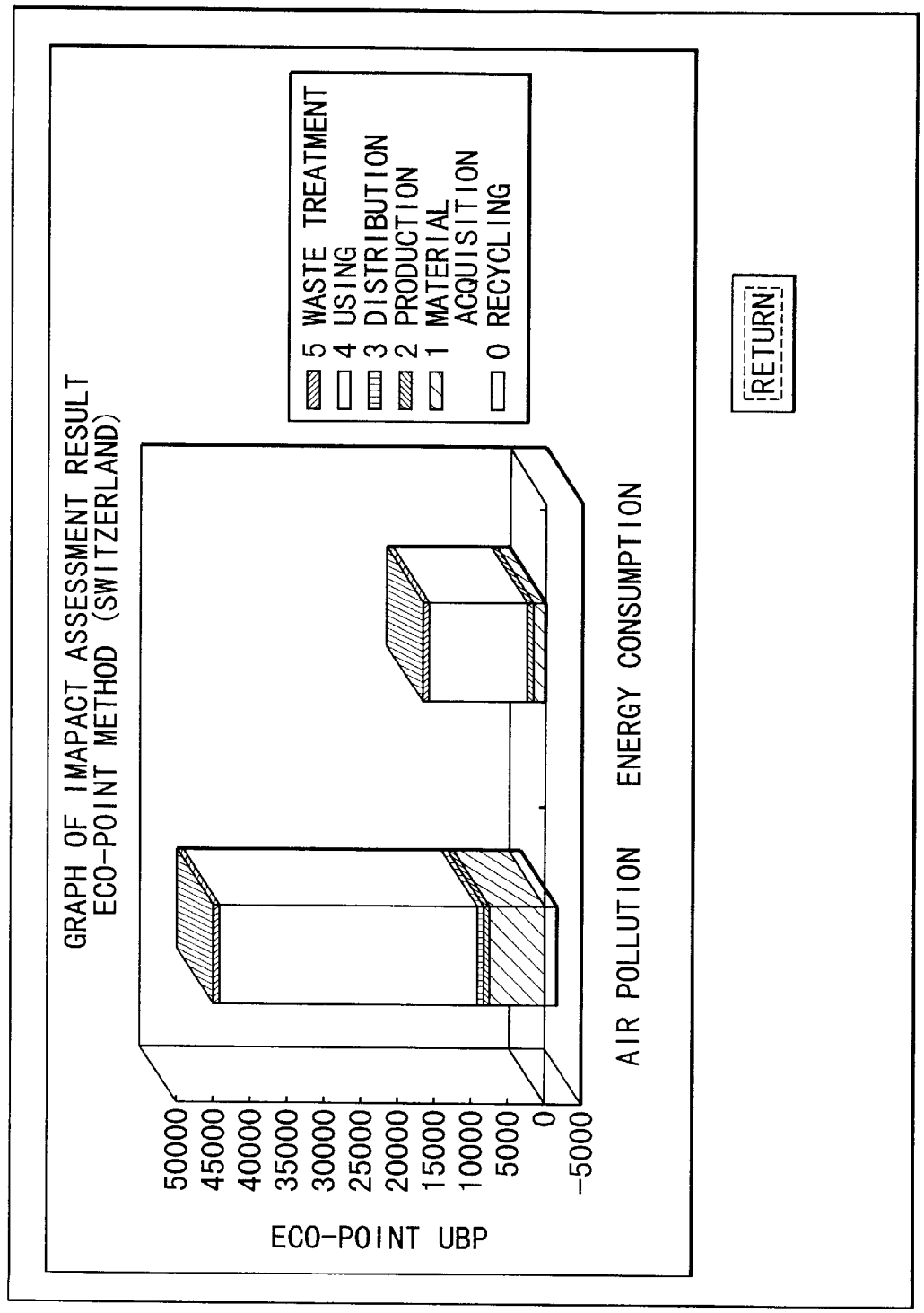
FIG. 46 illustrates an example of the output screen for impact assessment using the eco-point method in the second embodiment.

Pressing the eco-point method switch 103 causes the data table 108 of the model being edited to be read. The eco-point conversion table 14 is used for the following environmental loads: the energy consumption, the amount of $SO_x$ emission, and the amount of $NO_x$ emission. Then, the air pollution index 115 and energy consumption index 116 are converted into eco-points. The results are displayed in graph form (FIG. 46).

The environmental load assessment apparatus has not only the above-described functions but also the following simple assessment option switches: a calculation result output switch 55 for outputting and storing the data to and in a spreadsheet file, a maintenance switch 56 for the maintenance and operation of the database, and a model copy switch 44 for making easy minor changes and simulations.

As described so far, because the present embodiment provides the easy-to-use interactive software that enables the operator to enter the data easily, which was difficult in the prior art, designers themselves can make LCA assessments in the design stages. Therefore, the embodiment offers a powerful tool for development of the environmentally conscious products.

ANOTHER EMBODIMENT

In the first and second embodiments, the product life cycle is divided into six life cycle stages, a standard model is formed for each stage, each unit load emission is obtained from materials based on statistics, and only the parts used and number of parts unique to the product to be analyzed and the energy consumption in using the product are entered separately later, thereby making an analysis using the standard models. When manufacturers make use of the environmental load analysis results for product development, they do not necessarily obtain the data for each of the six life stages.

Next explained will be an example of dividing the life stage into two stages or three stages and forming a standard model for each life stage to provide a simpler system.

Figure 47:
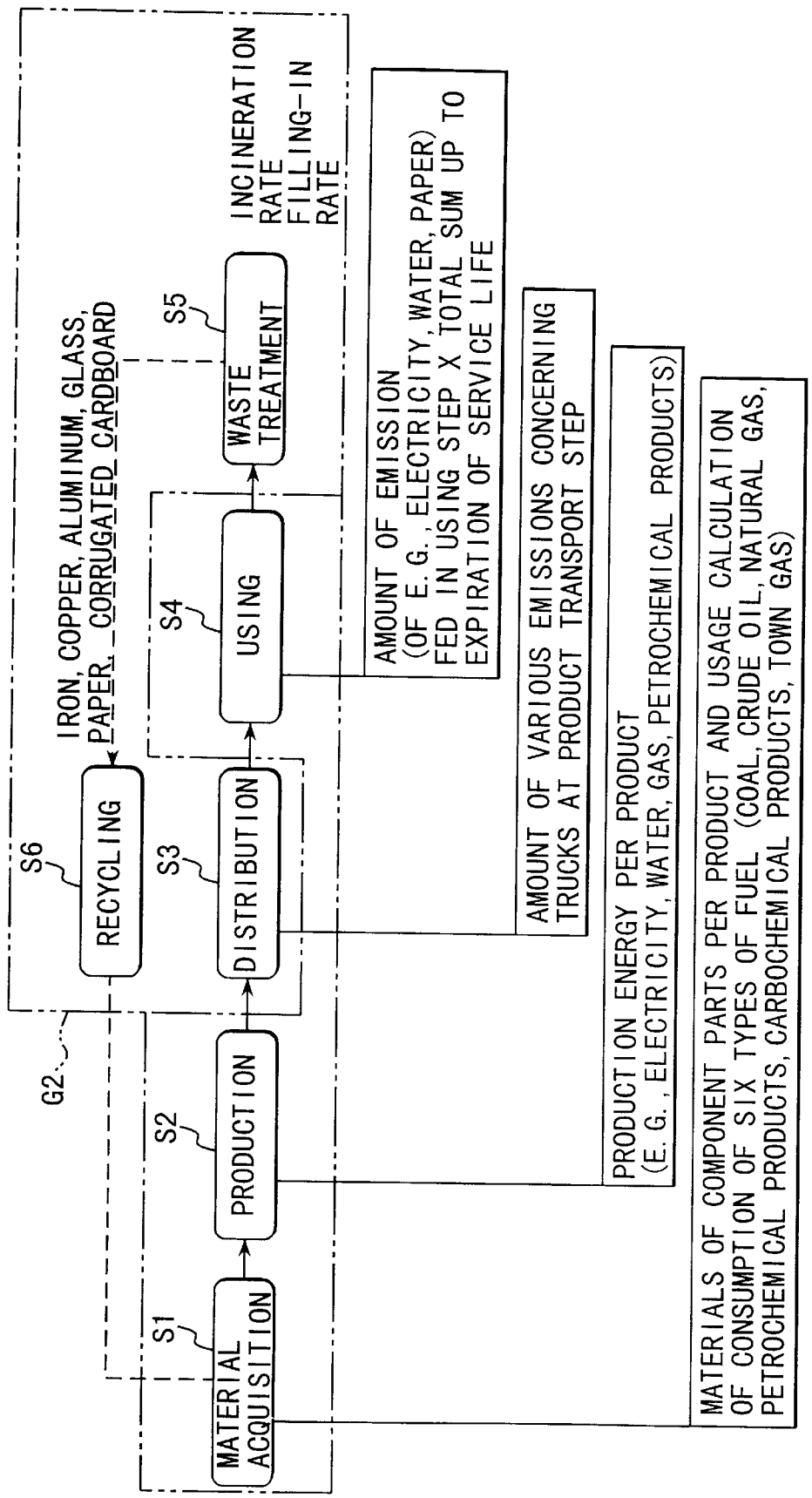
FIG. 47 is a block diagram to help explain another embodiment of the present invention.

FIG. 47 shows an example of dividing the life stage into two stages. In the example of FIG. 47, the material acquisition stage S1, production stage S2, and using stage S4 are grouped into a first group G1 and the distribution stage S3, waste treatment stage S5, and recycling stage S6 are grouped into a second group G2.

What the analyzer has to enter are the specification of a product to be analyzed, the component parts of the product, the number of the component parts, and the energy consumption of the product. The values of those items are determined in the design stages, so the design and development divisions have data on them. One of the purposes of LCA analysis is to help the design and development divisions develop the product. The values in the distribution stage S3, waste treatment stage S5, and recycling stage S6 do not change much and tend to be almost determined from the results of the first group G1. Therefore, it is sufficient to form standard models for the two groups of life stages.

Then, simplification is made by forming a standard model related to the first group 1 and a standard model related to the second group G2 as the equations stored in the processing section 22 of FIG. 2 or the environmental load equation storage section 39.

As a result, it is possible to construct a simpler easy-to-use system suitable for development people and designers.

With the present invention, the life cycle of a product is modeled into standard models for the individual life stages from the viewpoint of environmental load and the environmental load equations for the standard models are set up. The values of environmental loads concerning the component parts and materials of the product are obtained from the input-output tables, highly reliable statistical data, and from the unit load emissions found from the input-output tables. Just by entering the data items unique to the product to be analyzed, including the individual component parts and the number of parts, the environmental load of the product to be analyzed is determined using the environmental load equations for the standard models.

Therefore, the number of the data items to be prepared is reduced because modeling is done before analysis and because the value of each environmental load concerning the component parts and materials of the product is obtained from highly reliable statistical data and the unit load emissions found from the statistical data. Therefore, it is possible to provide a system that anyone can use readily and that enables fast, simple assessments suitable for life cycle assessment in the design stages even for such short-development-period products as electric appliances.

Furthermore, with the present invention, there is provided a graphic display function and general-purpose formats into which the unit load emission of each environmental load produced at each of the typical steps based on the specific models has been entered. As a result, the present invention produces the following effects:

(i) A detailed analysis of the steps throughout the whole life cycle of the product is not necessary. The operator can draw a diagram, while entering the data, so he or she can make the environmental assessment easily, while checking the data.

(ii) The designer can make a fast, simple assessment for life cycle assessment from the design stages and therefore use the result as an index for development of the environmentally conscious products.

The present invention is not limited to the above-described embodiments. It may be practiced or embodied in still other ways without departing from the spirit or essential character thereof. For instance, the results calculated from the general-purpose formats may be reflected on the environmental load indexes on eco-labels.

While in the embodiments, the input-output tables that the Prime Minister's Office has published has been used, the U.S. input-output tables may be used in the case of products manufactured and used in the U.S. The same is true for other countries.

The desired unit load emissions are not only obtained from the input-output tables, but also may be obtained from the database quoted by the Holland PRe's LCA program "SimaPro". Being able to use reliable data as the need arises, the present invention has wide applicability.

As described until now, with the present invention, it is possible to make an LCA analysis of products easily and readily even in the case of electric appliances required to be developed in a short time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. An apparatus for assessing a load that industrial products apply to the environment on the basis of the amount of emission of factors that apply a load to the environment, comprising:

an environmental load equation storage section that stores the environmental load equations modeled on a stage at which a product is produced and used and a stage of waste treatment and recycling, with the life cycle of the product being divided into at least the two stages;

a conversion coefficient storage section that stores conversion coefficients used to convert the amounts of materials and energy consumed in producing, using, waste-treating, and recycling the product into the amount of environmental load factors emitted as a result of those operations;

an input section for entering the amounts of materials and energy consumed in producing, using, waste-treating, and recycling the product, for each of the modeled stages;

a computing section that calculates the amount of emission of environmental load factors by applying the amounts of materials and energy fed and the conversion coefficients corresponding to the amounts to said environmental load equations;

an assessment section for assessing a load that the product applies to the environment on the basis of the calculation result; and an output section that outputs the assessment result.

2. An environmental load assessment apparatus according to claim 1, wherein said environmental load equation storage section stores the environmental load equations modeled on the material acquisition stage of the product on the basis of the kinds of raw materials of the product and the usage of the materials.

3. An environmental load assessment apparatus according to claim 1, wherein said environmental load equation storage section stores the environmental load equations modeled on the production stage of the product on the basis of the usage of energy at each manufacturing step.

4. An environmental load assessment apparatus according to claim 1, wherein said environmental load equation storage section stores the environmental load equations modeled on the distribution stage of the product on the basis of the product loadage of transport means and the fuel consumption.

5. An environmental load assessment apparatus according to claim 1, wherein said environmental load equation storage section stores the environmental load equations modeled on the using stage of the product on the basis of the number of times of use of the product, the service life of the product, and the frequency of use of the product.

6. An environmental load assessment apparatus according to claim 1, wherein said environmental load equation storage section stores the environmental load equations modeled on said waste treatment and recycling stage in such a manner that the amount of the materials of said product recycled is multiplied by the recovery rate and restoration rate to determine the amount of materials recycled and that the modeling is done so as to reduce the environmental loads.

7. An environmental load assessment apparatus according to claim 6, wherein the environmental load equations modeled on said waste treatment and recycling stage on the basis of the energy consumed in the discard on the assumption that the amount of the raw materials of the product not recycled is discarded and that for the materials recycled, the total amount of the materials minus the amount of materials recycled is discarded, are stored.

8. An environmental load assessment apparatus according to claim 6, wherein said assessment section includes means for simulating the change of the environmental load reduction effect in recycling by changing the recovery rate and restoration rate in said recycling.

9. An environmental load assessment apparatus according to claim 1, wherein said conversion coefficient storage section includes:

a material master that stores said input materials; and a conversion coefficient storage file that stores said conversion coefficients so that they may be associated with the material master.

10. An environmental load assessment apparatus according to claim 1, wherein said assessment section includes means for comparing the calculation results for plurality of models and said output section includes means for outputting said comparison results.

11. An environmental load assessment apparatus according to claim 1, wherein said assessment section includes means for assessing an impact on the environment on the basis of the amount of emission of said environmental load factors.

12. A computer program product that causes a computer system to assess a load that an industrial product applies to the environment throughout its life cycle, comprising:

a storage medium;

environmental load equations that are stored in said storage medium and that are modeled on a stage at which a product is produced and used and a stage of waste treatment and recycling, with the life cycle of the product being divided-into at least the two stages;

conversion coefficients that are stored in said storage medium and that are used to convert the amounts of materials and energy consumed in producing, using, waste-treating, and recycling the product into the amount of environmental load factors emitted as a result of those operations;

a storage section that is provided in said storage medium and that stores the amount of materials and energy consumed in producing, using, waste-treating, and recycling the product, for each of the modeled stages;

calculation specifying means that is stored in said storage medium and that gives to said computer system an instruction to calculate the amount of environmental load factors by applying the amounts of materials and energy fed and the conversion coefficients corresponding to the amounts to said environmental load equations;

assessment specifying means that is stored in said storage medium and that causes said computer system to assess a load that the product applies to the environment on the basis of the calculation result, and output specifying means that is stored in said storage medium and that gives to said computer system an instruction to output the assessment result.

13. A computer program product according to claim 12, wherein said equations stored in said storage medium include the environmental load equations modeled on the material acquisition stage of the product on the basis of the kinds of raw materials of the product and the usage of the materials.

14. A computer program product according to claim 12, wherein said equations stored in said storage medium include the environmental load equations modeled on the production stage of the product on the basis of the usage of energy at each manufacturing step.

15. A computer program product according to claim 12, wherein said equations stored in said storage medium include the environmental load equations modeled on the distribution stage of the product on the basis of the product loadage of transport means and the fuel consumption.

16. A computer program product according to claim 12, wherein said equations stored in said storage medium include the environmental load equations modeled on the using stage of the product on the basis of the number of times of use of the product, the service life of the product, and the frequency of use of the product.

17. A computer program product according to claim 12, wherein said equations stored in said storage medium include the environmental load equations modeled on said waste treatment and recycling stage in such a manner that the amount of the materials of said product recycled is multiplied by the recovery rate and restoration rate to determine the amount of materials recycled and that the modeling is done so as to reduce the environmental load.

18. A computer program product according to claim 17, wherein said equations stored in said storage medium include the environmental load equations modeled on said waste treatment and recycling stage on the basis of the energy consumed in the discard on the assumption that the amount of the raw materials of the product not recycled is discarded and that for the materials recycled, the total amount of the materials minus the amount of materials recycled is discarded.

19. A computer program product according to claim 18, further comprising means that is stored in said storage medium and that gives to said computer system an instruction to simulate the change of the environmental load reduction effect in recycling by changing the recovery rate and restoration rate in said recycling.

20. A computer program product according to claim 12, further comprising means that is stored in said storage medium and that gives to said computer system an instruction to compare the calculation results for plurality of models.

21. A computer program product according to claim 12, further comprising means that is stored in said storage medium and that gives to said computer system an instruction to assess an impact on the environment on the basis of the amount of emission of said environmental load factors.

\* \* \* \* \*